(12) United States Patent
Kimura

(10) Patent No.: US 6,392,618 B1
(45) Date of Patent: May 21, 2002

(54) ACTIVE MATRIX DEVICE, AND DISPLAY APPARATUS

(75) Inventor: Koichi Kimura, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/354,154

(22) Filed: Jul. 16, 1999

(30) Foreign Application Priority Data

Jul. 17, 1998 (JP) .......................... 10-203720

(51) Int. Cl.$^7$ ................................ G09G 3/00
(52) U.S. Cl. ................... 345/85; 345/31; 345/75.2; 345/55; 345/60; 349/41
(58) Field of Search .................. 345/85, 75.1, 104, 345/75.2, 76, 55, 60, 64, 82, 84, 87, 31, 75; 313/507, 509; 315/169.3; 349/116, 49, 41

(56) References Cited

U.S. PATENT DOCUMENTS

| | | | |
|---|---|---|---|
| 4,349,816 A | * 9/1982 | Miller et al. | 340/781 |
| 4,681,403 A | * 7/1987 | Te Velde et al. | 350/334 |
| 5,015,999 A | * 5/1991 | Imai et al. | 340/702 |
| 5,446,564 A | * 8/1995 | Mawatari et al. | 359/72 |
| 5,461,400 A | * 10/1995 | Ishii et al. | 345/182 |
| 5,635,795 A | * 6/1997 | Itoh et al. | 313/495 |

OTHER PUBLICATIONS

"Micromechanical Membrane Switches on Silicon", K. E. Peterson, IBM J Res. Develop.; vol. 23, No. 4, Jul. 1979 pp. 376–385.

* cited by examiner

Primary Examiner—Lun-Yi Lao
(74) Attorney, Agent, or Firm—Sughrue Mion, PLLC

(57) ABSTRACT

It is an object to provide an active matrix device which permits enlargement of the area and high-speed response and which serves in place of a semiconductor switch.

An active matrix device 35 incorporating scanning-signal electrodes 25 and data-signal electrodes 16 disposed in a matrix configuration and structured such that at least one matrix operating means and a light function device which is operated by the matrix operating means are disposed at intersections of the scanning-signal electrodes 25 and the data-signal electrodes 16, wherein the matrix operating means is mechanically-conductive switch 33 which is operated by static electric force. The mechanically-conductive switch 33 incorporates a thin flexible film 23 which is deflected by static electric stress, a conductive film 29 formed on the thin flexible film 23, a data-signal electrode 16 and a pixel electrode 27a of the light function device. When the thin flexible film 23 is deflected, the conductive film 29 is brought into contact with the data-signal electrode 16 and the pixel electrode 27.

13 Claims, 16 Drawing Sheets

MODULATED LIGHT

PRIOR ART

ACTIVE MATRIX DEVICE, AND DISPLAY APPARATUS

BACKGROUND OF THE INVENTION

1. Field of the Invention

The present invention relates to an active matrix device which incorporates two-dimensional matrix pixels arranged to be operated by an active matrix method, and more particularly to an active matrix device which enables a switching operation to be performed without use of a MOS semiconductor switch section and which are arranged for use in a two-dimensional image pickup device, a light modulating device, an exposing device and a display device.

2. Description of the Related Art

An active matrix device is known which incorporates two-dimensional matrix pixels which are operated by the active matrix method. The active matrix device is used in, for example, a MOS 2D image pickup device, an LCD, a thin-film EL device and an organic EL device.

An active matrix device of a type for use in the MOS 2D image pickup device incorporates a photodetecting device and a MOS transistor for switching the photodetecting device, provided for each pixel section. In the foregoing case, the active matrix device causes the photodetecting device of each pixel to photoelectrically convert light of the image so as to accumulate charges. The charges are scanned through the MOS transistors in a row-sequential manner so that the accumulated charges are extracted. Thus, serial electric signals are extracted to the outside.

The active matrix device is, as described above, used in the light modulating device, the exposing device and the display device for the LCD, the thin-film EL device and the organic EL device. FIG. 30 shows an example of the active matrix LCD. As shown in FIG. 30, the active matrix device incorporates a light function device 1, such as the light modulating device, the exposure device or the display device, and a MOS transistor 3 which are provided for each of pixels disposed in a matrix configuration. In the foregoing case, the active matrix device applies scanning pulse voltages Vg in the row-sequential manner to simultaneously turn the connected MOS transistors 3 on. In synchronization with this, data signal voltages Vb are applied to the image electrodes in the column direction. Thus, scanning is performed through the MOS transistor 3 so that charges are accumulated in the static capacitor of each pixel. After scanning of one row has been completed, the MOS transistors 3 are turned off. Thus, the charges accumulated in the capacitors are maintained. In response to data signals based on the accumulated charges, the light function devices 1 are operated so that modulation of light, exposure or display is performed.

The conventional active matrix devices is not substantially affected by the number of rows (the number of scanning lines) and capable of moving precise image with an excellent quality.

However, the active matrix device incorporating the conventional MOS semiconductor transistor of a type made of a-Si:H (amorphous silicon), poly-Si (polycrystalline silicon) or c-Si (crystal silicon) has the foregoing problems.

That is, a large number of patterning processes must be performed. Moreover, a film forming process and a process for doping impurities peculiar to the process for manufacturing the semiconductor regions must be performed. Therefore, a severe design condition has been required. As a result, the throughput and manufacturing yield deteriorate. Thus, enlargement of a device formation area cannot easily be realized with a low cost.

An attempt has been made that the patterning step is completed by a (screen) printing process in order to enlarge the device formation area and reduce the producing cost. However, the accuracy and quality under present circumstances are not sufficient. Therefore, the printing process has not been realized yet.

A TFT incorporating a glass substrate on which a-Si:H or poly-Si is formed easily encounters dispersion of electrons and positive holes which move in the semiconductor owning to lattice defects (impurities, vacancies and dislocations). Therefore, only a poor carrier mobility is permitted. Thus, a display device in the form of a precise and large-area structure which must respond at higher response suffers from reduction in the speed of response. Although use of c-Si free from considerable dispersion enables the speed of response to be raised, c-Si cannot easily be formed on the glass substrate which is a low cost substrate.

It is required to form the semiconductor films, while maintaining severe process conditions. Espetially on forming a junction, the impurity densities of both semiconductor films between which the junction is formed, must severely administered.

Since the TFT is a semiconductor device, there arises a problem in that a malfunction occurs owning to incidence of light and introduction of water, oxygen, ions and an organic material from outside. To prevent the malfunction, a light shielding film and/or a protective layer must be formed. Therefore, the design conditions and processing conditions are furthermore limited.

The following mechanically-conductive switch has been disclosed in the following document:

(1) Micromechanical Membrane Switches on Silicon, IBM J, RES. DEVELOP., VOL. 23, No. 4, JULY 1979, pp. 376–385.

In the foregoing document, as shown in FIG. 31 which is a plan view showing a matrix device and FIG. 32 which is a cross sectional view taken along line E—E, a mechanical switch has been suggested. That is, the matrix device operating switches comprising the transistors and non-linear devices which are replaced by plate springs are employed. Each plate spring has either end which is secured is displaced by static electric force. Thus, contact/separation of the contact point provided for the leading end of the plate spring is used. In the foregoing structure, the plate spring is formed by a thin $SiO_2$ film formed on a silicon substrate. The contact portion is made of a metal material such as gold.

Also a matrix type display device has been disclosed in the foregoing document. When a required data signal is written on a pixel electrode, a voltage is applied between a scanning-signal electrode and a $P^+$ silicon layer disposed below the scanning-signal electrode. Thus, the contact electrode, the data-signal electrode and the pixel electrode are made electrical contact with one another. As a result, a required potential is applied from the data-signal electrode to the pixel electrode. When the voltage between the scanning-signal electrode and the $P^+$ silicon layer is made to be zero, the contact of the foregoing electrode is separated. Thus, the data-signal electrode and the pixel electrode are made to be non-contact with each other. As a result, the potential of the pixel electrode can be maintained.

However, the mechanical switch, which has the above-mentioned structure in which either end is secured and, therefore, a cantilever spring structure is realized, has a possibility that mechanical bounds occur when contact/ separation is performed. To prevent this, the structure and the operating voltage must delicately be adjusted. Therefore, the design freedom of the device is restrained.

As can be understood from the plan view, the plate spring requires a great area. Therefore, the rate of opening is reduced. To raise the speed of response by lowering the voltage for operating the switch, the length of the plate spring must be elongated. In this case, the foregoing problems become more critical.

Since the structure disclosed in the foregoing document incorporates the Si substrate, the structure is made to be an opaque structure with respect to visible light. Therefore, the foregoing structure is not suitable to serve as a transmission-type light modulating device. Moreover, enlargement of the area cannot easily be realized.

In addition, only the reflecting-type light modulating device has been disclosed. No description has been performed about the light-transmission-type modulating device and the light emitting device.

Another mechanically-conductive switch has been disclosed in the following patent.

(2) U.S. Pat. No. 4,681,403

In the foregoing patent, a switch for operating a matrix device has been disclosed which has a structure that a plate spring having an end which is secured or a plate spring having two ends which are secured is made of an electro-optical material, such as liquid crystal or an electrophoretic material.

FIG. 33 is a plan view showing the matrix device disclosed in the foregoing patent. FIG. 34 is a cross sectional view taken along line F—F shown in FIG. 33. FIG. 35 is an equivalent circuit.

When the foregoing switch for operating the matrix device disclosed in the foregoing U.S. patent is operated to write a required data signal on a pixel electrode, a voltage is applied between each scanning-signal electrode and each data-signal electrode having the plate spring structure. As a result, the plate springs of the data-signal electrode are deflected so that the data-signal electrode and the pixel electrode are brought into electrical contact with each other. Thus, a required potential is supplied from the data-signal electrode to the pixel electrode. When the voltage between the scanning-signal electrode and the data-signal electrode is made to be zero, the data-signal electrode and the pixel electrode are brought to a non-contact state. As a result, the potential of the pixel electrode can be maintained.

The structure of the device disclosed in the foregoing U.S. patent incorporates the electro-optical material between two support substrates. Moreover, the foregoing switch is provided for either of the two substrates. In the foregoing case, introduction of fluid, such as liquid crystal, into the space between the two substrates sometimes causes a malfunction of the switch to occur. Moreover, the orientation of the liquid crystal is sometimes disordered. Although provision of a cover for fully covering the switch has been suggested, there arises a problem in that the process becomes too complicated and the area of the switch portion is undesirable enlarged owing to the provision of the cover.

The structure disclosed in the foregoing patent has the structure that the plate spring is electrically connected to the data-signal electrode. Therefore, a voltage must be applied to the position between the scanning-signal electrode and the data-signal electrode so as to operate the switch. Since the data-signal electrode is supplied with a required potential, the voltage which is supplied to the scanning-signal electrode must have an allowance. When the switch is made to be non-conductive or when scanning is not being performed, the structure of the switch and the voltage which must be applied must be considered to prevent a fact that the switch is made to be conductive regardless of the voltage of the data-signal electrode. The foregoing limitations excessively restrict the overall design freedom of the matrix device.

The static electric force for operating the switch depends on an electric field which is formed in a region in which the scanning-signal electrode and the data-signal electrode overlap. Therefore, satisfactory enlargement of the area of the region in which the two electrodes overlap for the purpose of enlarging the static electric force cannot easily be performed.

SUMMARY OF THE INVENTION

In view of the foregoing, an object of the present invention is to provide an active matrix device having a structure from which a semiconductor switch portion requiring a large number of patterning processes and severe design conditions and processing conditions is omitted so as to permit enlargement of the area and high-speed response and a light emitting device, a light modulating device, a photodetecting device, an exposing device and a display apparatus incorporating the foregoing active matrix device.

To achieve the foregoing object, a first aspect of a device is an active matrix device of the present invention, which comprises: a transparent substrate on which first scanning-signal electrode lines and data-signal electrode lines are allowed to intersect one another to one or two dimensionally dispose electrodes and structured such that at least one matrix operating means and a light function device are provided for each intersection, wherein the matrix operating means is a mechanically-conductive switch which is operated by static electric force.

The foregoing active matrix device has the structure that the light function device formed on the transparent substrate is operated by the mechanically-conductive switch having the mechanical structure. Thus, the light transmittance and the reflectance can be changed. Moreover, the manufacturing process and the structural materials can be simplified.

A second aspect of a device is an active matrix device according to the first aspect, wherein the mechanically-conductive switch has a thin flexible film which is moved by dint of a voltage which is applied between the first scanning-signal electrode and a second scanning-signal electrode disposed opposite to the first scanning-signal electrode to bring the data-signal electrode and a pixel electrode of the light function device into contact with each other.

In the foregoing active matrix device, the deflection of the thin flexible film is controlled in accordance with the voltage applied between the first and second scanning-signal electrodes so that the state of the switch is selectively set. A state of conduction between the data-signal electrode and the pixel electrode is determined for each pixel so that the state of each light function device is determined.

A third aspect of a device is an active matrix device for operating light function devices disposed one or two dimensionally by mechanically-conductive switches which are operated by static electric force, the active matrix device comprising: a plurality of parallel first scanning-signal electrodes in the form of stripes formed on a substrate; a plurality of parallel data-signal electrodes in the form of stripes disposed perpendicular to the first scanning-signal electrodes and formed at least at intersections with the first scanning-signal electrodes through insulating layers; common electrodes for pixel portions, light function devices and pixel electrodes which are sequentially laminated in a region on the substrate surrounded by the first scanning-signal electrodes and the data-signal electrodes; a plurality of support portions formed on the upper surfaces of the first scanning-signal electrodes; and thin flexible films and second scanning-signal electrodes disposed opposite to the first scanning-signal electrodes and laminated to be supported at the top ends of the support portions; and conductive films which are disposed opposite to the data-signal electrodes and the pixel electrodes such that contact is permitted through gaps and which are provided for the thin flexible films.

In the foregoing active matrix device, when the potential of the second scanning-signal electrode is the same as that of the first scanning-signal electrode, the thin flexible film is not supplied with the static electric force. Thus, the thin flexible film is not deflected. Therefore, the resistance between the data-signal electrode and the pixel electrode is infinitely large. Thus, the non-conductive state can be maintained. When the potential of the second scanning-signal electrode is different from that of the first scanning-signal electrode, the thin flexible film is deflected by the static electric force. As a result, the conductive film is brought into electrical contact with the data-signal electrode and the pixel electrode disposed below the thin flexible film in the direction of the deflection of the thin flexible film. As a result, the data-signal electrode and the pixel electrode are conducted to each other. When the voltage of each of the scanning-signal electrode is made to be zero, the thin flexible film is moved to the original position owning to the elastic force. As a result, the data-signal electrode and the pixel electrode are again brought to the non-conductive state.

A fourth aspect of a device is an active matrix device for operating light function devices disposed one or two dimensionally by mechanically-conductive switches which are operated by static electric force, the active matrix device comprising: a plurality of parallel first scanning-signal electrodes in the form of stripes formed on a substrate; a plurality of parallel data-signal electrodes in the form of stripes disposed perpendicular to the first scanning-signal electrodes and formed at least at intersections with the first scanning-signal electrodes through insulating layers such that the first scanning-signal electrodes are extended to substantially the overall region on the substrate surrounded by the first scanning-signal electrodes and the data-signal electrodes so that light function devices and pixel electrodes are sequentially laminated on the extended first scanning-signal electrodes; and a plurality of support portions formed on the insulating layers; and thin flexible films and second scanning-signal electrodes disposed opposite to the first scanning-signal electrodes and laminated to be supported at the top ends of the support portions; and conductive films which are disposed opposite to the data-signal electrodes and the pixel electrodes such that contact is permitted through gaps and which are provided for the thin flexible films.

In the foregoing active matrix device, when the potential of the second scanning-signal electrode has the same potential as that of the first scanning-signal electrode, the thin flexible film is not supplied with the static electric force. Thus, the thin flexible film is not deflected. Therefore, the resistance between the data-signal electrode and the pixel electrode is infinitely large. Thus, the non-conductive state can be maintained. When the potential of the second scanning-signal electrode is different from that of the first scanning-signal electrode, the thin flexible film is deflected by the static electric force. As a result, the conductive film is brought into electrical contact with the data-signal electrode and the pixel electrode disposed below the thin flexible film in the direction of the deflection of the thin flexible film. As a result, the data-signal electrode and the pixel electrode are conducted to each other. When the voltage of each of the scanning-signal electrode is made to be zero, the thin flexible film is moved to the original position owning to the elastic force. As a result, the data-signal electrode and the pixel electrode are again brought to the non-conductive state. Moreover, the common electrodes for the light function devices are the first scanning-signal electrode so that simplification of the process and cost reduction are permitted.

A fifth aspect of a device is an active matrix device for operating light function devices disposed one or two dimensionally by mechanically-conductive switches which are operated by static electric force, the active matrix device comprising: a plurality of parallel first scanning-signal electrodes in the form of stripes formed on a substrate; a plurality of parallel data-signal electrodes in the form of stripes disposed perpendicular to the first scanning-signal electrodes and formed at least at intersections with the first scanning-signal electrodes through insulating layers; pixel electrodes, light function devices and common electrodes for pixel portions which are sequentially laminated in a region on the substrate surrounded by the first scanning-signal electrodes and the data-signal electrodes; a plurality of support portions formed on the insulating layers; and thin flexible films and second scanning-signal electrodes disposed opposite to the first scanning-signal electrodes and laminated to be supported at the top ends of the support portions; and conductive films which are disposed opposite to the data-signal electrodes and the pixel electrodes such that contact is permitted through gaps and which are provided for the thin flexible films.

In the foregoing active matrix device, when the potential of the second scanning-signal electrode has the same potential as that of the first scanning-signal electrode, the thin flexible film is not supplied with the static electric force. Thus, the thin flexible film is not deflected. Therefore, the resistance between the data-signal electrode and the pixel electrode is infinitely large. Thus, the non-conductive state can be maintained. When the potential of the second scanning-signal electrode is different from that of the first scanning-signal electrode, the thin flexible film is deflected by the static electric force. As a result, the conductive film is brought into electrical contact with the data-signal electrode and the pixel electrode disposed below the thin flexible film in the direction of the deflection of the thin flexible film. As a result, the data-signal electrode and the pixel electrode are conducted to each other. When the voltage of each of the scanning-signal electrode is made to be zero, the thin flexible film is moved to the original position owning to the elastic force. As a result, the data-signal electrode and the pixel electrode are again brought to the non-conductive state. Thus, the active matrix device can be realized by a structure in which the pixel electrode is provided for the substrate and the common electrodes for pixels are disposed in the upper portion.

A sixth aspect of a device is an active matrix device according to the fifth aspect, which further comprises an upper substrate disposed opposite to the substrate, structured to hold the thin flexible films and the signal electrodes disposed on the substrate and joined to the upper surfaces of the common electrodes for the pixel portions.

In the foregoing active matrix device, when the potential of the second scanning-signal electrode has the same potential as that of the first scanning-signal electrode, the thin flexible film is not supplied with the static electric force. Thus, the thin flexible film is not deflected. Therefore, the resistance between the data-signal electrode and the pixel electrode is infinitely large. Thus, the non-conductive state can be maintained. When the potential of the second scanning-signal electrode is different from that of the first scanning-signal electrode, the thin flexible film is deflected by the static electric force. As a result, the conductive film is brought into electrical contact with the data-signal electrode and the pixel electrode disposed below the thin flexible film in the direction of the deflection of the thin flexible film. As a result, the data-signal electrode and the pixel electrode are conducted to each other. When the voltage of each of the scanning-signal electrode is made to be zero, the thin flexible film is moved to the original position owning to the elastic force. As a result, the data-signal electrode and the pixel electrode are again brought to the non-conductive state. Thus, the structure of the active matrix device can be realized in which the pixel electrode is provided for the lower substrate and the common electrodes for pixels are provided for the upper substrate such that the two substrates are positioned opposite to each other.

A seventh aspect of a device is an active matrix device, which comprises: light function devices disposed one or two dimensionally and arranged to be operated by mechanically-conductive switches which are operated by static electric force, wherein the thin flexible film switches and the light function devices are formed on individual surfaces and the mechanically-conductive switches and the light function devices are electrically connected to one another.

The foregoing active matrix device can be structured such that the mechanically-conductive switch is formed on either side of the substrate and the light function device is provided for another side. As a result, the utilization easiness and extensibility can be improved.

An eighth aspect of a device is an active matrix device which has a structure that a plurality of parallel first scanning-signal electrodes in the form of stripes are formed on the right side of a first substrate, a plurality of parallel data-signal electrodes in the form of stripes disposed perpendicular to the first scanning-signal electrodes are formed at least at intersections with the first scanning-signal electrodes through insulating layers, pixel electrodes, light function devices and common electrodes for pixel portions are sequentially laminated in a reverse side region of the first substrate surrounded by the first scanning-signal electrodes and the data-signal electrodes, a second substrate is, through a color filter, joined to the surface of the light function device opposite to the first substrate such that the second substrate is disposed opposite to the first substrate, a plurality of support portions are formed on the insulating layers of the first substrate, thin flexible films and second scanning-signal electrodes disposed opposite to the first scanning-signal electrodes are laminated to be supported at the top ends of the support portions, the right and reverse sides of the first substrate are conducted to each other to extend the pixel electrodes of the light function devices to positions adjacent to the data-signal electrodes, and conductive films disposed opposite to the data-signal electrodes and the pixel electrodes such that contact is permitted through gaps are provided for the thin flexible films.

In the foregoing active matrix device, when the potential of the second scanning-signal electrode has the same potential as that of the first scanning-signal electrode, the thin flexible film is not supplied with the static electric force. Thus, the thin flexible film is not deflected. Therefore, the resistance between the data-signal electrode and the pixel electrode is infinitely large. Thus, the non-conductive state can be maintained. When the potential of the second scanning-signal electrode is different from that of the first scanning-signal electrode, the thin flexible film is deflected by the static electric force. As a result, the conductive film is brought into electrical contact with the data-signal electrode and the pixel electrode disposed below the thin flexible film in the direction of the deflection of the thin flexible film. As a result, the data-signal electrode and the pixel electrode are conducted to each other. When the voltage of each of the scanning-signal electrode is made to be zero, the thin flexible film is moved to the original position owning to the elastic force. As a result, the data-signal electrode and the pixel electrode are again brought to the non-conductive state. When the pixel electrodes are conducted to the reverse side of the substrate by the through holes, the light function devices can be formed on the reverse side of the substrate opposite to the mechanically-conductive switch. Since the second substrate is joined to the opposite surface of the substrate adjacent to the light modulating device, a space between the substrates is formed. Thus, a light modulating material can be introduced into the space. As a result, a low-cost and precise active matrix device having a large screen can be constituted.

An active matrix device according to the aspect 9 is characterized by a structure that the two ends of the thin flexible film are supported.

The foregoing active matrix device incorporates the thin flexible film which has the supported two ends. Therefore, a stable switching operation is permitted. As a result, occurrence of a mechanical bound can be prevented without a necessity of finely adjusting the operating voltage.

An active matrix device according to the aspect 10 is characterized by a structure that the thin flexible film having a length substantially corresponding to the length of one pixel is provided for each pixel.

The foregoing active matrix device is able to furthermore enlarge the area of the electrode. Thus, the static electric force can maximally be used and, therefore, the required operating voltage can be lowered.

An active matrix device according to the aspect 11 is characterized by a structure that the conductive film is made of metal.

Since the foregoing active matrix device incorporates the conductive film made of metal, the mobility of carriers can be enhanced and the speed of response can considerably be raised as compared with a conventional active matrix device incorporating a-Si:H, poly-Si or c-Si.

An active matrix device according to the aspect 12 is characterized by a structure that a plurality of the mechanically-conductive switches are provided for one pixel.

The foregoing active matrix device enables a normal switching operation to be performed if any one of the switches suffers a breakdown. Therefore, the stability of the operation can furthermore be improved.

An active matrix device according to the aspect 13 is characterized by a structure that the plural mechanically-conductive switches are connected in series.

If either switch encounters short circuit, the foregoing active matrix device can be operated by another switch.

An active matrix device according to the aspect 14 is characterized in that the plural mechanically-conductive switches are connected in parallel.

If either switch encounters a defect in the contact operation thereof, another switch enables the operation of the foregoing active matrix device to be performed.

An active matrix device according to the aspect 15 is characterized by a structure that the mechanically-conductive switch is sealed in a rare gas atmosphere.

The foregoing active matrix device is able to effectively prevent switching discharge.

An active matrix device according to the aspect 16 is characterized by a structure that the mechanically-conductive switch incorporates a resistor for preventing switching discharge.

The foregoing active matrix device incorporating the resistor for preventing switching discharge is able to easily prevent switching discharge with a low cost.

An active matrix device according to the aspect 17 is characterized by a structure that the mechanically-conductive switch is supplied with a cleaning electric current at predetermined intervals of time.

The foregoing active matrix device is able to easily break and remove the oxide film on the contact portion of the mechanically-conductive switch.

A light emitting device according to the aspect 18 comprises a light function device of the active matrix device according to any one of aspects 1 to 17, wherein the light function device serves as the light emitting device.

The foregoing light emitting device causes display to be realized with light emitted from the light emitting device so that high speed display by dint of light is realized.

A light modulating device according to the aspect 19 comprises: a light function device of the active matrix device according to any one of claims 1 to 17, wherein the light function device serves as the light modulating device.

The foregoing light modulating device is able to selectively set a transmission/non-transmission state by the operation of the light modulating device.

A light modulating device according to the aspect 20 is characterized by a structure that the light modulating device is liquid crystal.

The foregoing light modulating device has the structure that the light modulating device is liquid crystal. Therefore, the light modulating device can be constituted by using a conventional technique.

A light modulating device according to the aspect 21 is characterized by a structure that the light modulating device is a device for modulating light by deforming a thin flexible film with static electric force.

The light modulating device has the structure that the thin flexible film is deflected by static electric force. Therefore, a mechanically-conductive switch using the static electric force can be realized by a simple structure. In the foregoing case, all of the operation portions can be realized by mechanical structures. Therefore, the manufacturing process and the materials can be simplified. Moreover, an electro-mechanical light modulating device can be realized in which the movable portions are moved by static electric force to change the light transmittance.

A light modulating device according to the aspect 22 is characterized by a structure that the light function device performs light modulation by applying an electric field between each of the pixel electrodes and each of the electrodes disposed opposite to the pixel electrodes to deflect the thin flexible films provided for the light function devices so as to generate an optical interference effect of a multilayered film.

In the foregoing light modulating device, the thin flexible film interrupts the optical path if no voltage is applied between the electrodes. If a voltage is applied between the electrodes, the thin flexible film is deflected to change the optical lengths of the two films. As a result, an optical interference effect of the multilayered film is generated. As a result, light modulation is permitted.

According to another aspect according to the aspect 23, there is provided a photodetecting device comprising: a light function device of the active matrix device according to any one of claims 1 to 17, wherein the light function device serves as the photodetecting device.

The foregoing photodetecting device has the structure that light of an image is photoelectrically converted by the photodetecting device of each pixel to accumulate charges. Then, the accumulated charges are scanned through the mechanically-conductive switch in the row-sequential manner to extract the accumulated charges. Thus, light of the image can be converted into a serial electric signal.

According to another aspect according to the aspect 24, there is provided an exposing device comprising: a light function device of the active matrix device according to any one of claims 1 to 17, wherein the light function device serves as the exposing device.

The foregoing exposing device is able to modulate ultraviolet rays emitted from, for example, a plane light source to expose an ultraviolet-ray sensitive material.

According to another aspect according to the aspect 25, there is provided a display apparatus comprising: a light function device of the active matrix device according to any one of aspects 1 to 17, wherein the light function device serves as the light modulating device, and the light modulating device modulates light emitted from a plane light source to cause a fluorescent member to emit light with modulated light.

In foregoing display apparatus, the fluorescent member is caused to emit light for display by emitted light so that high-speed display with light is realized.

A display apparatus according to the aspect 26 is characterized by a structure that the plane light source emits ultraviolet rays.

The foregoing display apparatus is permitted to use a relatively low-cost and low-pressure mercury lamp or the like. Therefore, the cost of the apparatus can be reduced.

DESCRIPTION OF THE PREFERRED EMBODIMENTS

Embodiments of an active matrix device according to the present invention will now be described with reference to the drawings (the structure of claim 3).

Figure 1:
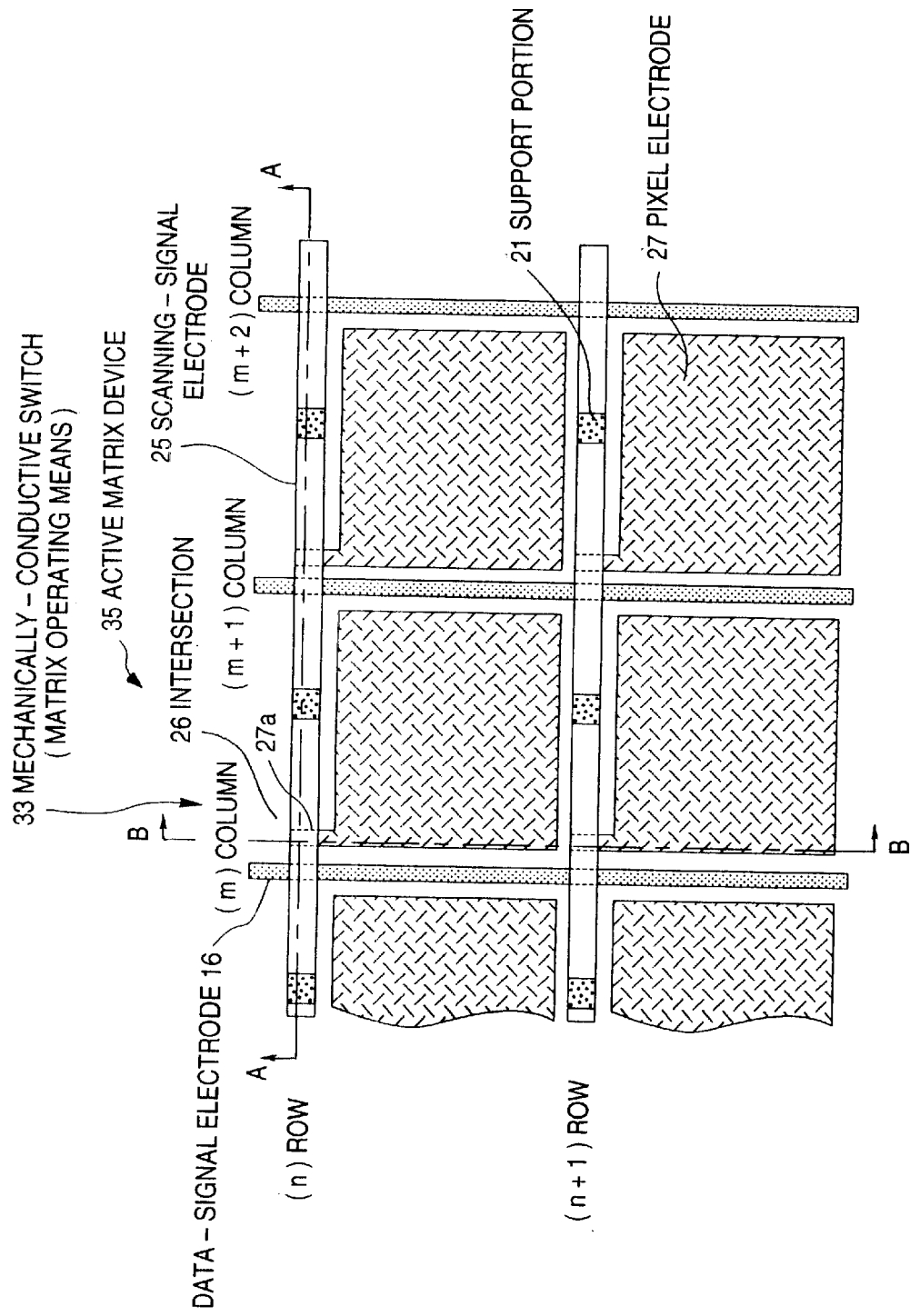
FIG. 1 is a plan view showing a first embodiment of an active matrix device according to the present invention.
Figure 2:
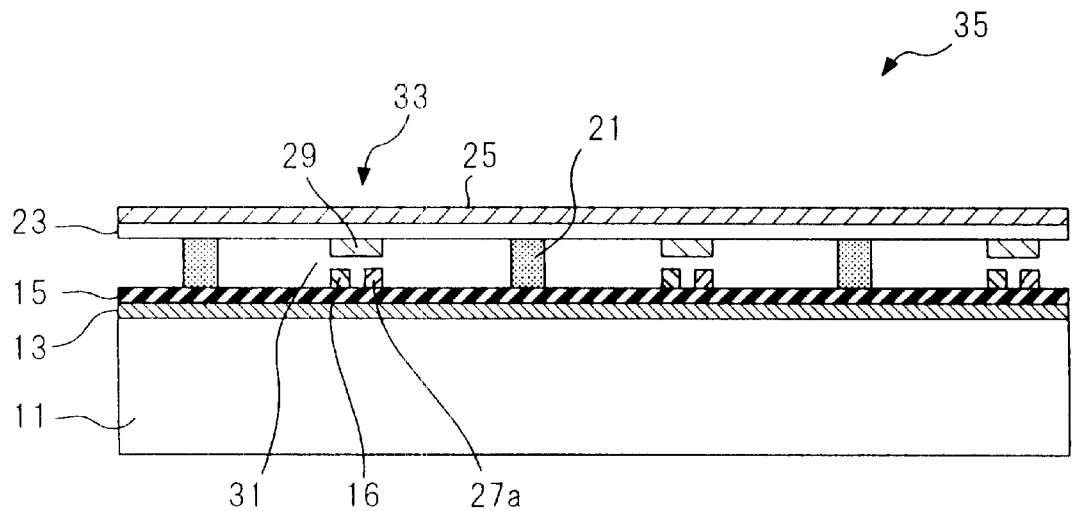
FIG. 2 is a cross sectional view taken along line A—A shown in FIG. 1.
Figure 3:
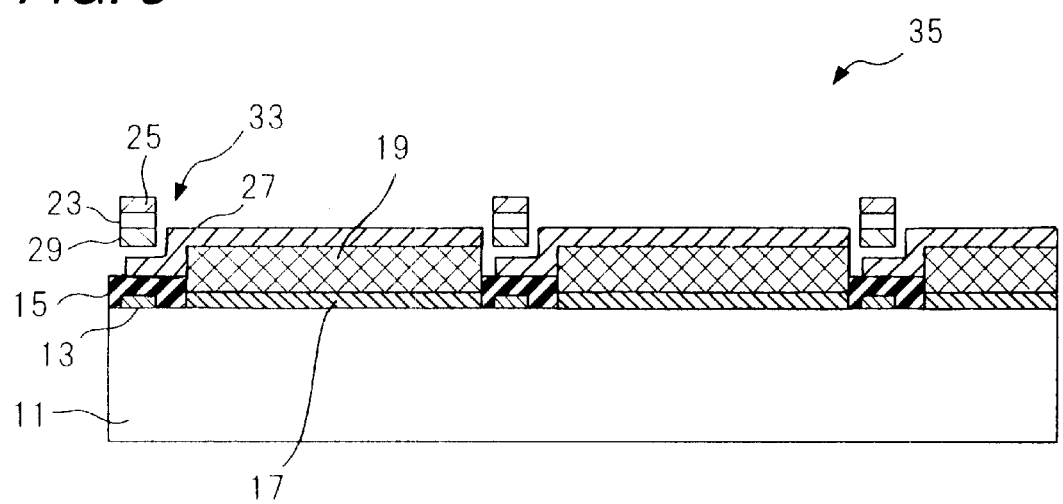
FIG. 3 is a cross sectional view taken along line B—B shown in FIG. 1.

FIG. 1 is a plan view showing a first embodiment of the active matrix device according to the present invention. FIG. 2 is a cross sectional view taken along line A—A shown in FIG. 1. FIG. 3 is a cross sectional view taken along line B—B shown in FIG. 1.

In this embodiment, it is characterized in that mechanically-conductive switches 33 for switching pixcels in the light function device respectively, are disposed in the intersection portions 26 of the data-signal electrodes 16 and the scanning-signal electrodes 25 arranged in the matrix configuration. A plurality of parallel common electrodes 13 for scanning signals (first scanning-signal electrodes) in the form of stripes are formed on a substrate 11. Insulating layers 15 for covering at least the common electrodes 13 for scanning signals is formed on the substrate 11. Moreover, a plurality of parallel data-signal electrodes 16 in the form of stripes perpendicular to the common electrodes 13 for scanning signals are formed on the substrate 11. In rectangular regions on the substrate 11 surrounded by the common electrodes 13 for scanning signals and the data-signal electrodes 16, common electrodes 17 for pixel portions and light function devices 19 are sequentially laminated.

A plurality of support portions 21 are formed on the stripe insulating layers 15 formed along the common electrodes 13 for scanning signals, the support portions 21 being formed at the same intervals in the lengthwise direction of the insulating layers 15. Stripe-shape thin flexible films 23 and scanning-signal electrodes 25 (second scanning-signal electrodes) are sequentially laminated so as to be supported at the top ends of the support portions 21. The thin flexible films 23 are made of an insulating material such as silicon oxide film; silicon nitride film; glass film and polymer film, and conductive films 29 are formed at a contact portion of the thin flexible films 23. The thin flexible films 23 and the scanning-signal electrodes 25 supported by the support portions 21 as described above are, through a gap, disposed opposite to the common electrodes 13 for scanning signals covered with the insulating layers 15. The scanning-signal electrodes 25 and the data-signal electrodes 16 are disposed in a matrix configuration having a plurality of intersection portions 26 (see FIG. 1).

Note that the support portions 21 formed individually as described above may be formed by another method with which ends of, for example, a thin hollow film are secured.

Pixel electrodes 27 which interpose the light function devices 19 together with the common electrodes 17 for pixel portions are formed on the upper surface of the light function devices 19. A portion 27a (see FIG. 1) of each of the pixel electrodes 27 is extended to a position adjacent to each of the data-signal electrodes 16 on the insulating layers 15. As shown in FIG. 2, the data-signal electrodes 16 and the portions 27a of the pixel electrodes 27 have the same height and disposed in parallel with each other such that gaps are provided. That is, the data-signal electrodes 16 and the portions 27a are made to be non-conductive state.

A conductive film 29 made of a metal material is formed on the lower surface of each of the thin flexible films 23. The conductive film 29 may be made of aluminum, copper, silver, gold or the like. The conductive film 29 is formed opposite to the data-signal electrode 16 and the pixel electrode 27 through a gap 31. The thin flexible films 23, the data-signal electrodes 16, the pixel electrodes 27 and the conductive film 29 constitute mechanically-conductive switches 33 which are means for operating the matrix. The mechanically-conductive switches 33 are disposed in the intersection portions 26 of the data-signal electrodes 16 and the scanning-signal electrodes 25 arranged in the matrix configuration.

Figure 4:
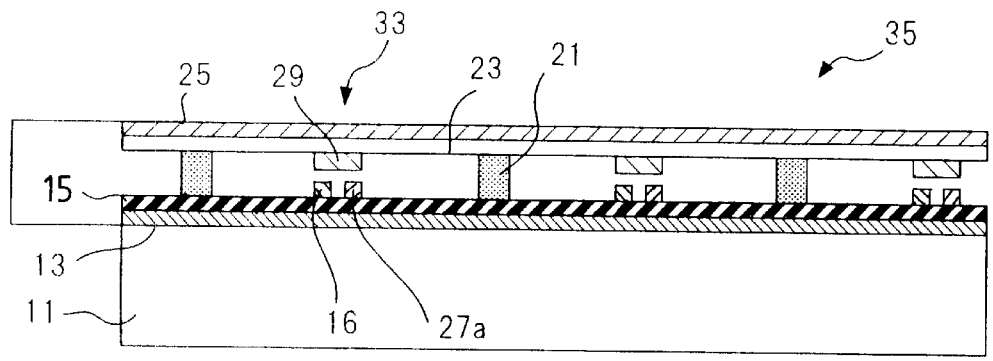
FIG. 4 is a diagram showing a state of the operation of the active matrix device shown in FIG. 1.
Figure 4:
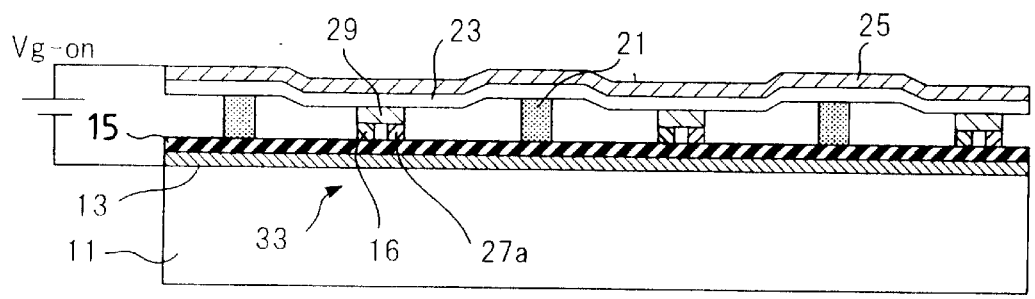

FIG. 4 is a diagram showing the operation of the active matrix device shown in FIG. 1.

In the active matrix device 35 structured as described above, the thin flexible film 23 is not deflected because the thin flexible film 23 is not supplied with static electric force when the potential of the scanning-signal electrode 25 is the same as that of the common electrode 13 for scanning signals, as shown in FIG. 4(a). Therefore, the data-signal electrode 16 and the pixel electrode 27a are not brought into electrical contact with one another. Thus, the non-contact state is maintained.

When a voltage is applied to the scanning-signal electrode 25 to have a different potential from that of the common electrode 13 for scanning signals, the thin flexible film 23 is deflected toward the substrate 11 by dint of the static electric force, as shown in FIG. 4(b). Thus, the conductive film 29 is brought into electrical contact with the data-signal electrode 16 and the pixel electrode 27a disposed below the thin flexible films 23. As a result, the potential of the data-signal electrode 16 and that of the pixel electrode 27a are made to be the same.

When the voltage of each of the scanning-signal electrode 25 is made to be zero, the thin flexible film 23 is moved to the original position by the elastic force. Thus, the thin flexible film 23 is separated from the data-signal electrode 16 and the pixel electrode 27a. As a result, a state shown in FIG. 4(a) is realized so that the data-signal electrode 16 and the pixel electrode 27 are again brought to the non-contact state.

Figure 5:
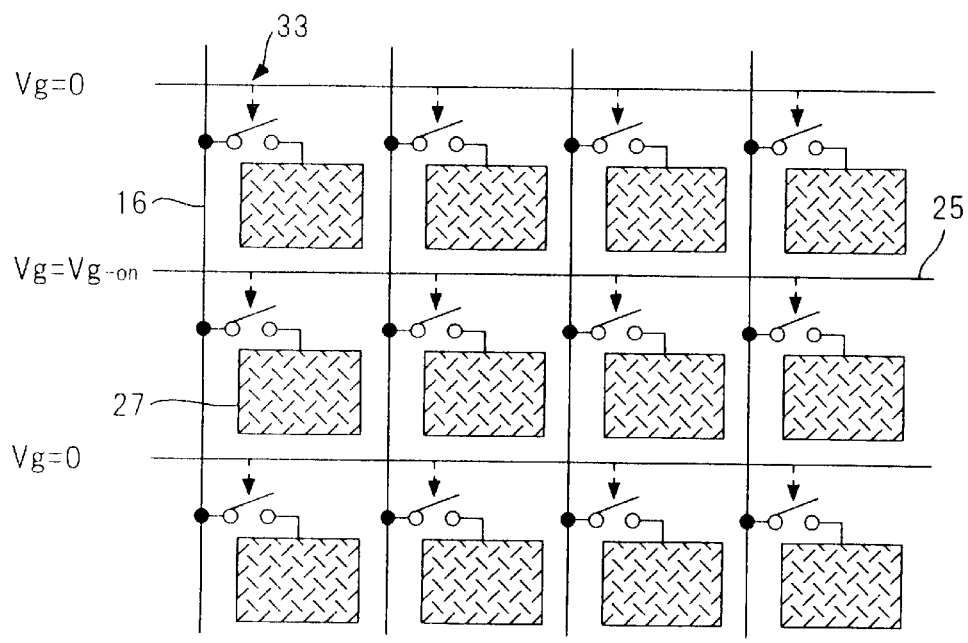
FIG. 5 is a diagram showing a matrix operation.

FIG. 5 shows the operation of the matrix.

In a case of the matrix shown in FIG. 5, the pixel electrode 27 of the scanning-signal electrode 25 applied with voltage Vg-on for deflecting the thin flexible film 23 is conducted with the data-signal electrode 16. As a result, the potentials of the data-signal electrode 16 and the pixel electrode 27 are made to be the same. The electrically independent potentials of the pixel electrodes of the other scanning-signal electrodes are maintained.

Figure 6:
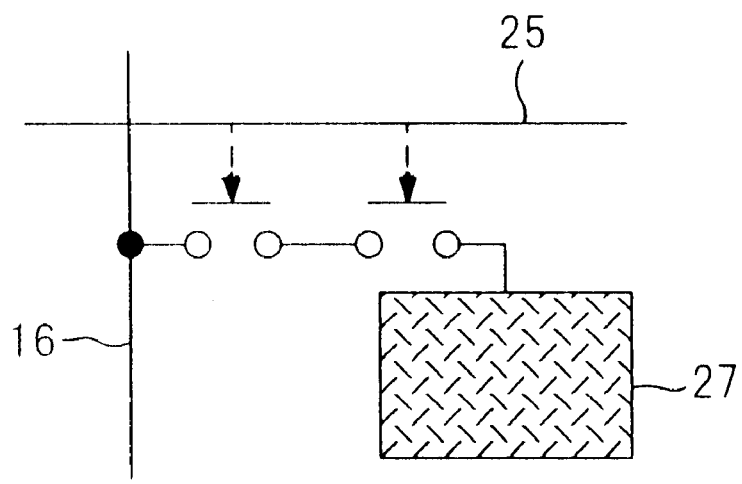
FIG. 6 is a diagram showing a structure having a plurality of switches provided for one pixel.
Figure 6:
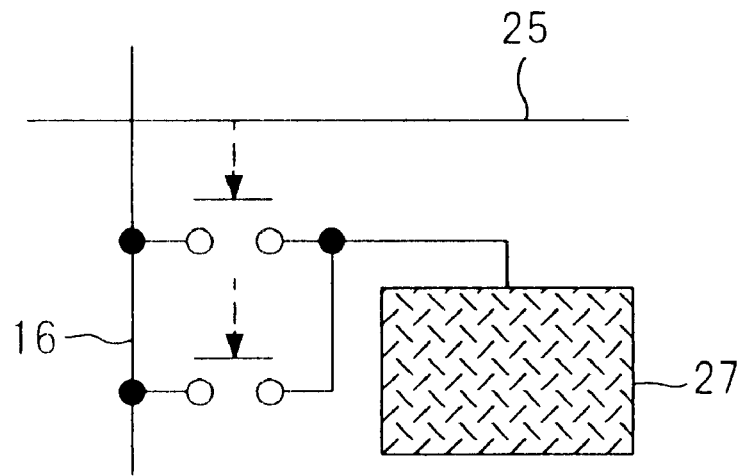

When the foregoing matrix operation is realized, a plurality of switches may be provided for one pixel, as shown in FIG. 6. A state is considered in which a plurality of switches are connected in series as shown in FIG. 6(a). In this case, if either of the switches encounters a defect of short circuit, another switch enables the operation to be performed. If either switch encounters a defective contact operation, a structure in which switches are connected in parallel as shown in FIG. 6(b) enables the operation to be performed by another switch.

Figure 7:
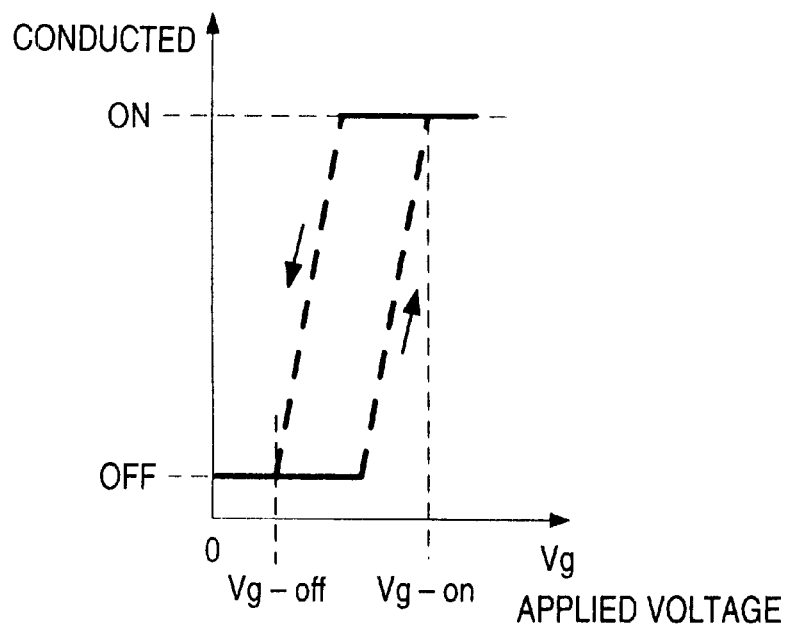
FIG. 7 is a hysteresis graph showing switching characteristics of a thin flexible film.

FIG. 7 is a hysteresis graph showing the switching characteristics of the thin flexible film.

Assuming that the voltage of the scanning-signal electrode 25 with respect to the common electrode 13 for scanning signals is Vg, the switching characteristics realized by the thin flexible film 23 has the hysteresis characteristics shown in FIG. 7. That is, when Vg is not lower than Vg-on, conduction is established (ON). When Vg is Vg-off or lower, non-conductive state is realized (OFF).

Figure 8:
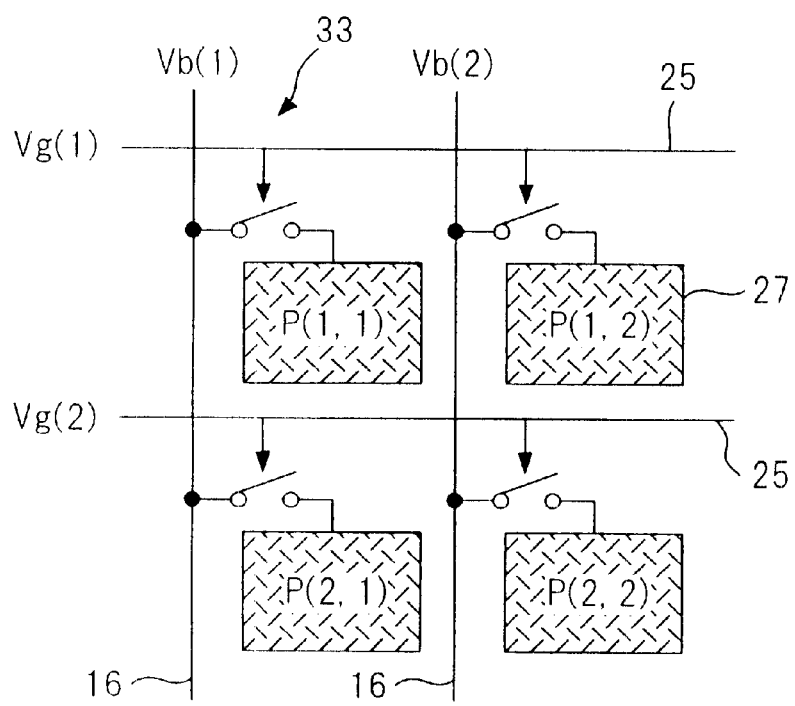
FIG. 8 is a schematic view showing pixel electrodes disposed in a two-row and two-column configuration.

FIG. 8 is a schematic view showing two-row×two column pixel electrodes.

An operation for writing the following potentials on the two-row×two column pixel electrodes 27 shown in FIG. 8 will now be described.

P(1, 1)=Vp1, P(1, 2)=Vp2, P(2, 1)=Vp3, P(2, 2)=Vp4

The pixel electrodes 27 at P (1, 1) and P (1, 2) or those at P (2, 1) and P (2, 2) disposed on the same row are connected to a mechanically-conductive switch which is operated by a common scanning-signal electrode 25. The scanning-signal electrode 25 is applied with the potential Vg. The pixel electrodes 27 at P (1, 1) and P (2, 1) or those at P (1, 2) and P (2, 2) disposed on the same column are connected to the common data-signal electrode 16 as a result of the operation of the mechanically-conductive switch. The data-signal electrode 16 is applied with potential Vb.

When the active matrix device 35 structured as described above is operated, the pixel electrodes 27 at P (1, 1) and P (1, 2) or those at P (2, 1) and P (2, 2) are scanned in a row-sequential manner in response to scanning signals. In synchronization with this, data signals corresponding to the scanned pixel electrodes 27 are applied to the pixel electrodes 27 at P (1, 1) and P (2, 1) or those at P (1, 2) and P (2, 2) disposed on the column.

Figure 9:
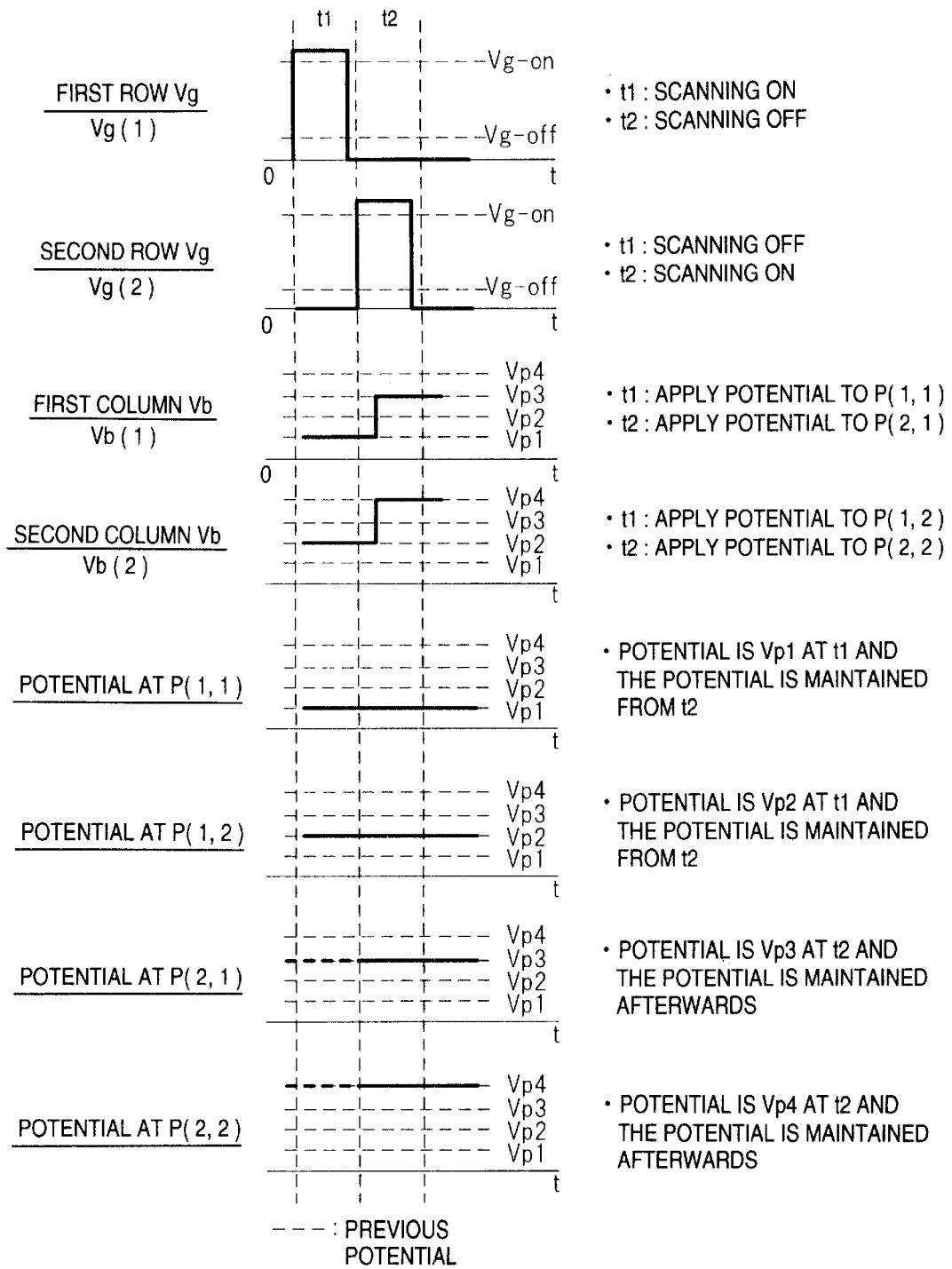
FIG. 9 is a diagram showing the operation which is performed when voltages having different waveforms are applied to the active matrix device to write data on each pixel.

FIG. 9 is a diagram showing the operation which is performed when voltages having individual waveforms are applied to the active matrix device to write data on each pixel.

The matrix device is applied with voltages having waveforms shown in FIG. 9.

For example, Vg (1) on the first row is applied with the following voltage:

t1: scanning ON t2: scanning OFF

Vg (2) on the second row is applied with the following voltage:

t1: scanning OFF t2: scanning ON

Vb (1) on the first column is applied with the following voltage:

t1: potential to P (1, 1) t2: potential to P (2, 1)

Vb (2) on the first column is applied with the following voltage:

t1: potential to P (1, 2) t2: potential to P (2, 2)

As a result, the potential at P (1, 1) is made such that the potential at t1 is Vp1 and that in a period from t2 is maintained.

The potential at P (1, 2) is made such that the potential at t1 is Vp2 and that in a period from t2 is maintained.

The potential at P (2, 1) is made such that the potential at t2 is Vp3 and that in a period from t2 is maintained.

The potential at P (2, 2) is made such that the potential at t2 is Vp4 and that in a period from t2 is maintained.

As described above, the scanning-signal electrodes 25 are turned on in the row-sequential manner. In synchronization with this, arbitrary potentials are applied from the data-signal electrodes 16. If the scanning-signal electrodes 25 are turned off afterwards, the potentials of the pixel electrode 27 can be maintained if the light function device 19 is a capacitor type device. The other operations are performed similarly to a conventional transistor active matrix device.

As described above, the active matrix device 35 is provided with the mechanically-conductive switches 33 in the intersection portions 26 of the scanning-signal electrodes 25 and the data-signal electrodes 16 disposed in the matrix configuration. The mechanically-conductive switch 33 deflects the thin flexible film 23 by the static electric force. Thus, the data-signal electrodes 16 and the pixel electrodes 27 are turned on or off by dint of the mechanical operation. Therefore, the switch portions can be operated mechanically in place of the conventional MOS semiconductor switch portions provided for the intersections. As a result, the following problems experienced with the active matrix device incorporating the conventional semiconductor switch portions can be overcome.

That is, the steps for forming films peculiar to the process for manufacturing a semiconductor and a step for doping impurities are not required. Therefore, the number of patterning steps can be reduced. Moreover, the design conditions can be moderated. As a result, the throughput and manufacturing yield can be improved and enlargement of the area is permitted with a low cost.

The conventional active matrix device containing a-Si:H, poly-Si or c-Si and suffering from poor mobility of the carriers has encountered reduction in the speed of response. When the mobility of the carriers is compared, the following relationships are satisfied:

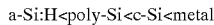

a-Si:H<poly-Si<c-Si<metal

Therefore, the mechanically-conductive switches 33 which permit metal to be employed to form the conductive film 29 is able to enhance the mobility of carriers as compared with the conventional semiconductor switch. Therefore, high speed response can be realized if a precise and large area structure is formed.

Since the necessity of forming the semiconductor film can be eliminated, severe administering of the joining conditions and the densities of impurities is not required. Therefore, the processing conditions can be moderated.

Since the mechanically-conductive switches 33 are employed, an adverse influence of incidence of light and introduction of water, oxygen, ions and an organic material from outside can satisfactorily be eliminated as compared with the semiconductor. As a result, a malfunction occurring due to the disturbance can be prevented. Therefore, the reliability of the operation and durability can be improved.

The overall body of the active matrix device 35 or at least the mechanically-conductive switches 33 may be sealed to permit injection of rare gas. The sealed structure is able to effectively prevent switching discharge of the mechanically-conductive switch 33. A resistor for preventing switching discharge may be provided for the mechanically-conductive switch 33. If the conductive film 29 is made of gold, oxidation caused from switching discharge or the like can furthermore effectively be prevented.

In order to positively break and remove oxidized film of the contact of the mechanically-conductive switch 33, a cleaning current may be supplied at predetermined intervals of time.

Figure 10:
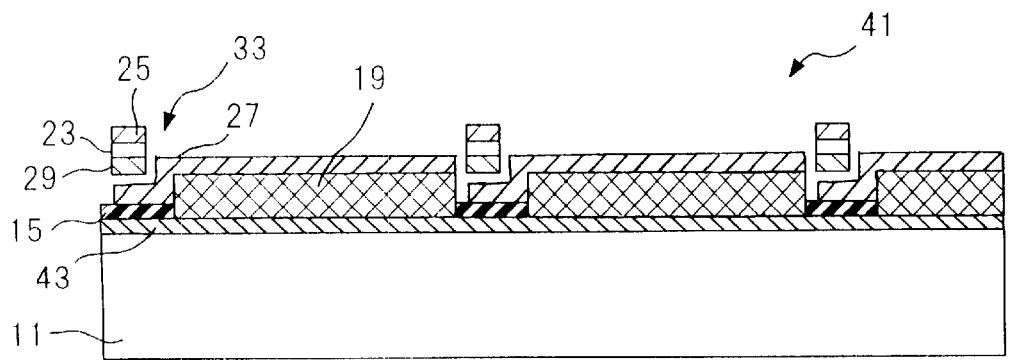
FIG. 10 is a cross sectional view showing a second embodiment of the active matrix device in a direction perpendicular to the scanning-signal electrodes.

A second embodiment of the active matrix device according to the present invention will now be described (the structure according to the aspect 4). FIG. 10 is a cross sectional view showing the active matrix device according to the second embodiment in a direction perpendicular to the scanning-signal electrodes.

In the following embodiments, members which are the same as those shown in FIG. 3 are given the same reference numerals and the same members are omitted from description.

An active matrix device 41 incorporates common electrodes 43 for pixel portions and scanning signals structured to serve as both of the common electrodes for scanning signals and common electrodes for pixel portions.

The structure of the active matrix device 41 permits the common electrodes for scanning signals and the common electrodes for pixel portions can be made of the same material by the same manufacturing process. Therefore, the number of patterning processes can be reduced and the manufacturing process can be facilitated.

Figure 11:
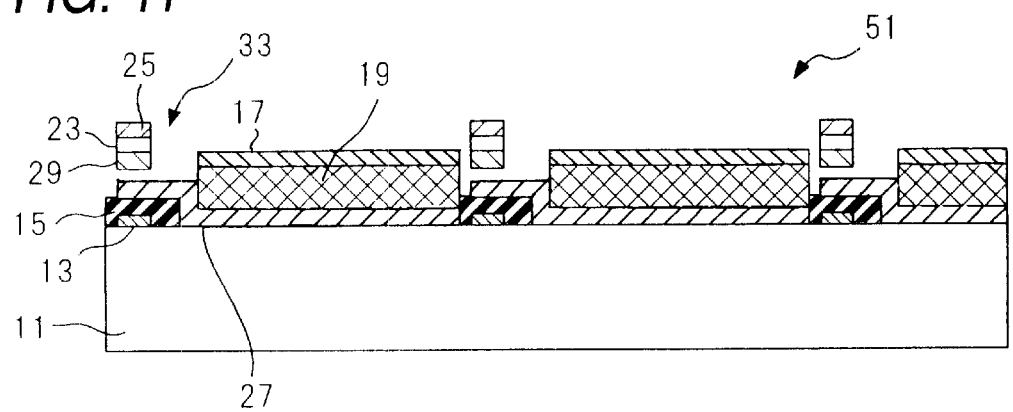
FIG. 11 is a cross sectional view showing a third embodiment of the active matrix device in a direction perpendicular to the scanning-signal electrodes.

A third embodiment of the active matrix device according to the present invention will now be described (the structure according to the aspect 5). FIG. 11 is a cross sectional view showing the active matrix device according to the third embodiment in a direction perpendicular to the scanning-signal electrodes.

The active matrix device 51 according to this embodiment incorporates the pixel electrodes 27 provided for the substrate 11. The common electrodes 17 for pixel portions are formed on the surfaces of the light function devices 19. That is, as compared with the first embodiment shown in FIG. 3, the positions of the pixel electrodes 27 and the common electrodes 17 for pixel portions are made to be opposite across the light function devices 19.

The active matrix device 51 may be structured such that either of the pixel electrode 27 or the common electrode 17 for pixel portions is provided for the upper surface or the lower surface of the light function device 19. Therefore, the restriction on the design conditions and manufacturing process can be moderated. Thus, the degree of freedom of the foregoing conditions can be widened.

Figure 12:
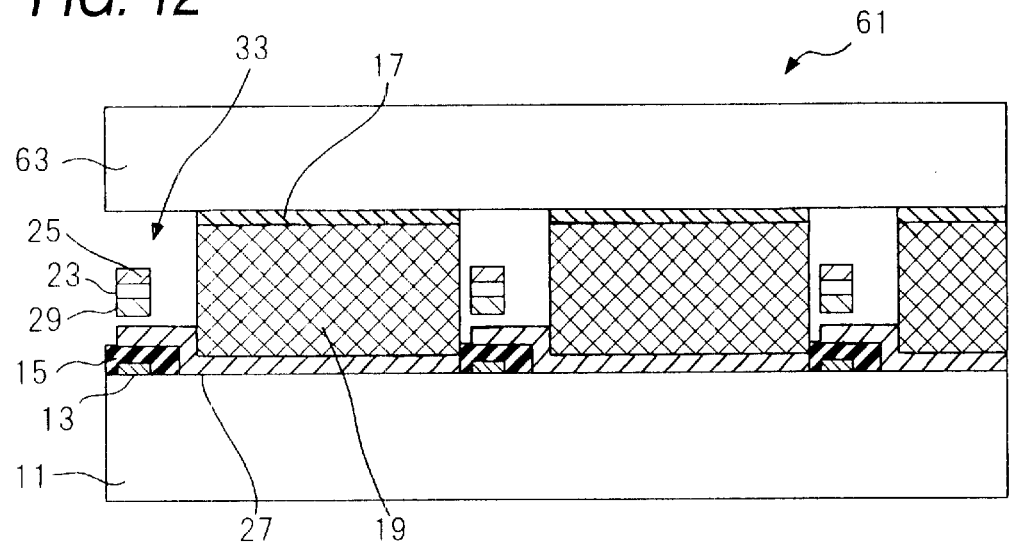
FIG. 12 is a cross sectional view showing a fourth embodiment of the active matrix device in a direction perpendicular to the scanning-signal electrodes.

A fourth embodiment of the active matrix device according to the present invention will now be described (the structure according to the aspect 6). FIG. 12 is a cross sectional view showing the active matrix device according to the fourth embodiment in a direction perpendicular to the scanning-signal electrodes.

The active matrix device 61 according to this embodiment incorporates the pixel electrodes 27 disposed adjacent to the substrate 11. Moreover, the common electrodes 17 for pixel portions are provided for the upper substrate 63. The upper substrate 63 is disposed opposite to the substrate 11 such that the common electrodes 17 for pixel portions are joined to the light function devices 19. That is, the mechanically-conductive switches 33 and the light function devices 19 are disposed between the two parallel substrates which are the substrate 11 and the upper substrate 63.

The foregoing active matrix device 61 has the structure that the periphery of the substrate 11 and the upper substrate 63 is sealed hermetically. Thus, an inert gas such as a rare gas is introduced between the two substrates so that easy sealing of the mechanically-conductive switches 33 is permitted. Thereby the mechanically-conductive switches 33 is kept in a good state without being oxided. (Deterioration caused by oxidation of the contact portion can be prevented.) A fifth embodiment of the active matrix device according to the present invention will now be described (the structure according to the aspect 18).

Figure 13:
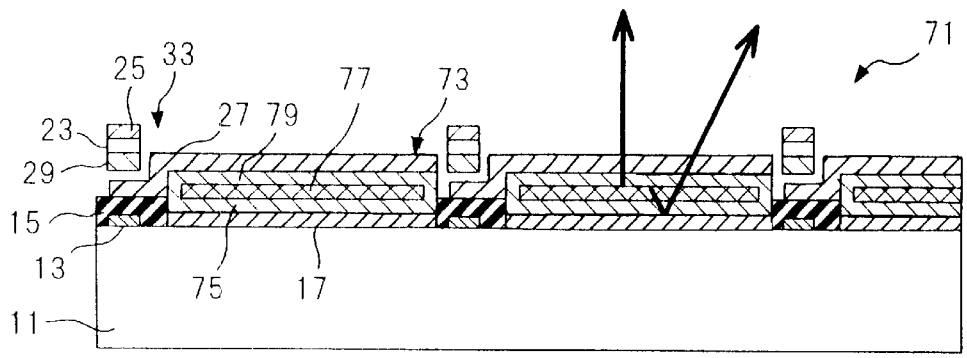
FIG. 13 is a cross sectional view showing a fifth embodiment of the active matrix device in a direction perpendicular to the scanning-signal electrodes.

FIG. 13 is a cross sectional view showing the active matrix device according to the fifth embodiment in a direction perpendicular to the scanning-signal electrodes.

The active matrix device 71 according to this embodiment incorporates thin-film EL 73 which are light emitting devices and which are employed as the light function devices. Reflecting films made of metal, such as Al, and serving as common electrodes 17 for pixel portions are formed on the substrate 11. A lower insulating layer 75, an EL light emitting layer (for example, a thin ZnS:Mn film) 77 and an upper insulating layer 79 are sequentially laminated on the common electrodes 17 for pixel portions. Transparent electrodes (made of ITO or the like) serving as the pixel electrodes 27 are formed on the upper insulating layer 79.

In the active matrix device 71, the potential is supplied to the pixel electrodes 27 by following the above-mentioned procedure to apply a pixel voltage to the common electrodes 17 for pixel portions. When the polarity of the voltage is changed for each scanning signal to perform the operation with AC, the thin-film EL 73 can be operated to emit light at an arbitrary intensity. In this embodiment, the pixel electrodes 27 form the display surface. Light emitted downwards is reflected by the common electrodes 17 for pixel portions made of aluminum so as to be emitted upwards. When the display surface is the lower portion, the transparent electrodes (the pixel electrodes 27) and the reflecting films (the common electrodes 17 for pixel portions) are inverted.

A sixth embodiment of the active matrix device according to the present invention will now be described (the structure according to the aspect 18).

Figure 14:
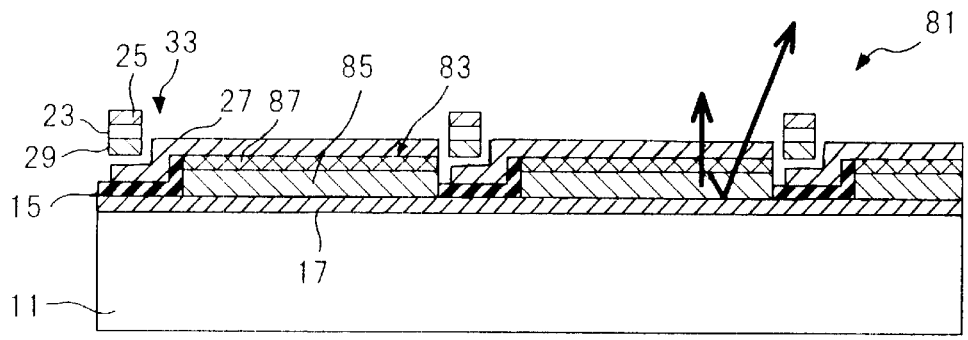
FIG. 14 is a cross sectional view showing a sixth embodiment of the active matrix device in a direction perpendicular to the scanning-signal electrodes.

FIG. 14 is a cross sectional view showing the active matrix device according to the sixth embodiment in a direction perpendicular to the scanning-signal electrodes.

The active matrix device 81 according to this embodiment incorporates low molecular weight organic EL 83 which are light emitting devices and which are employed as the light function devices. Reflecting films made of metal, such as Al or Mg:Ag alloy, and serving as cathode electrodes for the common electrodes 17 for pixel portions and the organic EL are formed on the glass substrate 11. An electron transporting layer/light emitting layer (made of Alq or the like) 85, a hole transporting layer (made of α-NPD or the like) 87 and transparent electrodes (made of ITO or the like) which are organic EL anode electrodes which are the pixel electrodes 27 are sequentially laminated on the common electrodes 17 for pixel portions.

The pixel electrodes 27 and the data-signal electrodes 16 (see FIG. 1) of the active matrix device 81 are connected to one another by following the above-mentioned procedure. An operating circuit is provided to cause a constant current to be supplied from the data-signal electrodes 16. As a result, an electric current flows from the pixel electrode 27 to the common electrode 17 for pixel portions through the organic EL film only when scanning has been performed. Thus, the organic EL 83 emits light. The above-mentioned method enables an operation with a constant current to be performed stably as compared with the simple matrix. Thus, uniform display can be performed. In this embodiment, the pixel electrodes 27 form the surface. Light emitted downwards is reflected by the common electrodes 17 for pixel portions made of, for example, Al, so as to be emitted upwards.

A seventh embodiment of the active matrix device according to the present invention will now be described (the structure according to the aspect 18).

Figure 15:
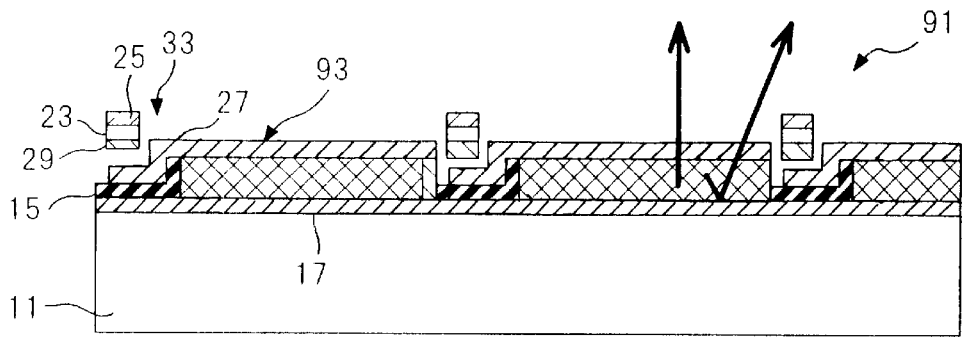
FIG. 15 is a cross sectional view showing a seventh embodiment of the active matrix device in a direction perpendicular to the scanning-signal electrodes.

FIG. 15 is a cross sectional view showing the active matrix device according to the seventh embodiment in a direction perpendicular to the scanning-signal electrodes.

The active matrix device 91 according to this embodiment incorporates polymer-type organic EL 93 which are light emitting devices and which are employed as the light function devices. Reflecting films made of metal, such as Al or Mg:Ag alloy, and serving as cathode electrodes for the common electrodes 17 for pixel portions and the polymer-type organic EL are formed on the glass substrate 11. A polymer-type organic EL 93 and transparent electrodes (made of ITO or the like) which are anode electrodes of the organic EL serving as the pixel electrodes 27 are sequentially laminated on the common electrodes 17 for pixel portions.

The pixel electrodes 27 and the data-signal electrodes 16 (see FIG. 1) of the active matrix device 91 are connected to one another by following the above-mentioned procedure. An operating circuit is provided to cause a constant current to be supplied from the data-signal electrodes 16. As a result, an electric current flows from the pixel electrode 27 to the common electrode 17 for pixel portions through the organic EL film only when scanning has been performed. Thus, the polymer-type organic EL 93 emits light. The above-mentioned method enables an operation with a constant current to be performed stably as compared with the simple matrix. As a result, uniform display can be performed. Also in this embodiment, light emitted downwards is reflected by the common electrodes 17 for pixel portions made of, for example, Al, so as to be emitted upwards.

An eighth embodiment of the active matrix device according to the present invention will now be described (structures according to the aspects 19 and 20).

Figure 16:
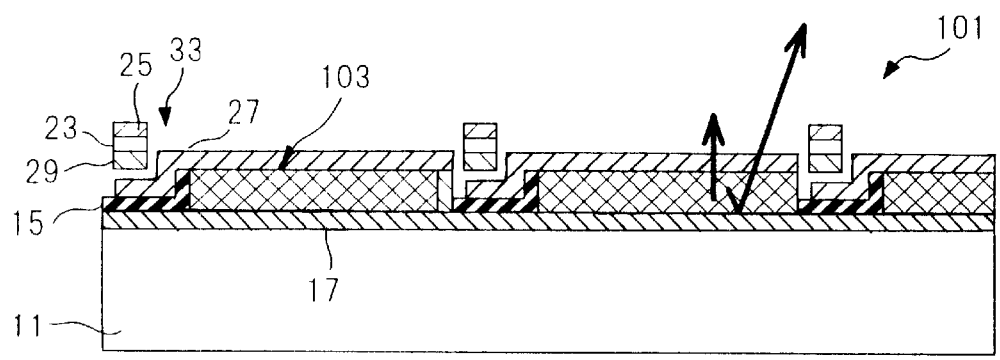
FIG. 16 is a cross sectional view showing an eighth embodiment of the active matrix device in a direction perpendicular to the scanning-signal electrodes.

FIG. 16 is a cross sectional view showing the active matrix device according to the eighth embodiment in a direction perpendicular to the scanning-signal electrodes.

The active matrix device 101 according to this embodiment incorporates light modulating devices 103 which modulate light with a voltage (an electric field) or an electric current and which serve as the light function devices. The light modulating devices 103 may be made of high molecular liquid crystal, high molecular dispersion type liquid crystal or electro-optical crystal (PLZT, BSO or the like).

The active matrix device 101 can be arranged to perform any one of dispersion/transmission, absorption/transmission, control of the phase of light, control of polarization, diffraction and control of interference. When application to the control of polarization is performed, optical films, such as a polarizing plates, are arbitrarily added to the structure shown in FIG. 16.

As described above, this embodiment may be formed into either of two types of structures which are the transmission type structure and the reflection type structure. When the transmission type structure is formed, it is preferable that both types of the electrodes are transparent conductive films made of ITO or the like. When the reflection type structure is formed, the electrodes adjacent to the substrate are made of reflection metal, such as Al, and those adjacent to the display surface are constituted by transparent conductive films made of ITO or the like.

A ninth embodiment of the active matrix device according to the present invention will now be described (the structures according to the aspects 19, 21 and 22).

Figure 17:
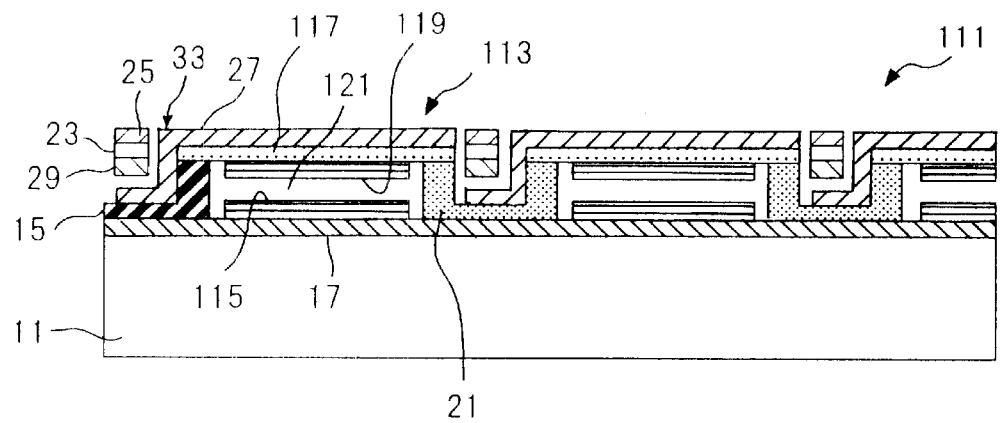
FIG. 17 is a cross sectional view showing a ninth embodiment of the active matrix device in a direction perpendicular to the scanning-signal electrodes.

FIG. 17 is a cross sectional view showing the active matrix device according to the ninth embodiment in a direction perpendicular to the scanning-signal electrodes.

Figure 18:
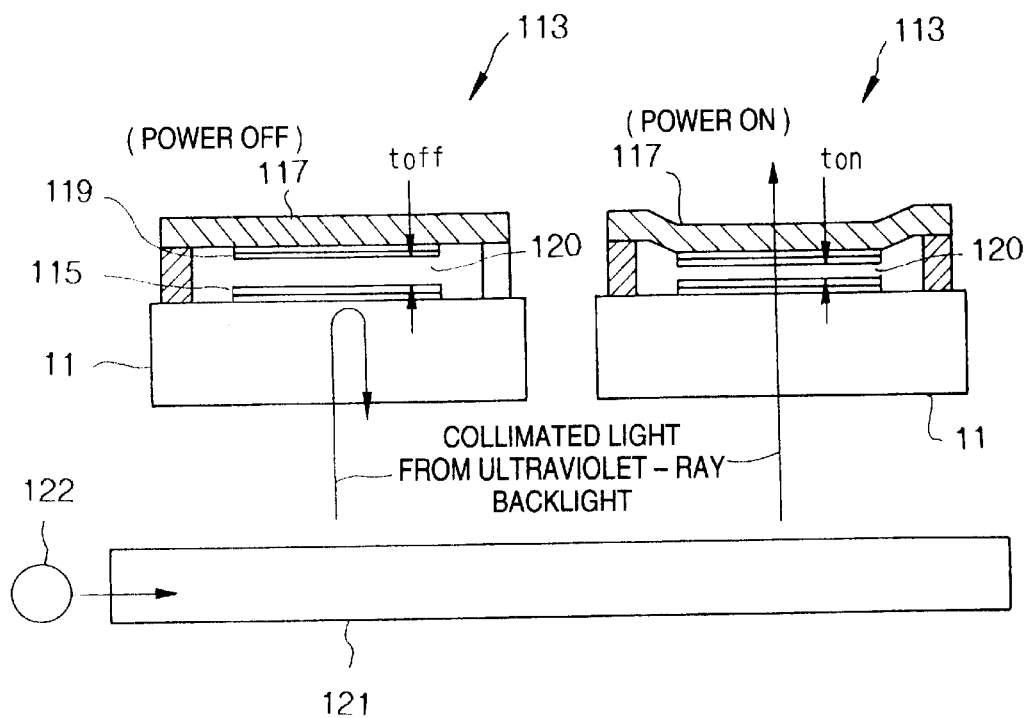
FIG. 18 is a diagram showing a state of the operation of the active matrix device shown in FIG. 17.
Figure 19:
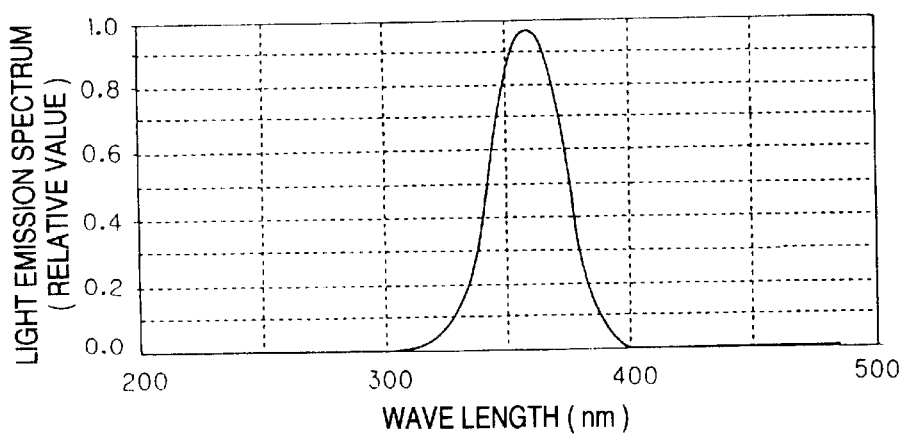
FIG. 19 is a graph showing spectral characteristics of a low-pressure mercury lamp for a black light.

FIG. 18 is a diagram showing a state of the-operation of the active matrix device shown in FIG. 17.

The active matrix device 111 according to this embodiment incorporates Fabry-Perot type light modulating devices 113 which serve as light modulating devices for modulating light with voltage. In particular, the Fabry-Perot type light modulating devices 113 modulate light by deforming the thin flexible films with static electric force.

In a state in which two planes are disposed in parallel with each other, Fabry-Perot interference occurs such that incident light repeats reflection and transmission. Thus, light is divided into a multiplicity of light beams which are paralleled with each other. The transmitted light beams overlap and interfere with one another at point at infinity. Assuming that the angle made between a perpendicular of the plane and incident light is i, the optical path difference between two adjacent light beams is given by $x = nt \cdot \cos i$, where n is a refractive index between two planes and t is a distance. When the optical path difference x is an integer multiple of wavelength λ, the transmitted light beams intensify mutually. When the optical path difference x is an odd-number multiple of the half wavelength, the transmitted light beams cancel each other. If the phase is not changed, when $2nt \cdot \cos = m\lambda$, the transmitted light beam is maximized and when $2nt \cdot \cos = (2m+1)\lambda/2$, the transmitted light beam is minimized.

Note that m is a positive integer.

When the thin flexible film is moved such that the optical path difference x has a predetermined value, light emitted from the signal electrode can be modulated so as to be emitted from the thin flexible film.

The common electrodes 17 for pixel portions which are transparent with respect ultraviolet rays are formed on the substrate 11 which is transparent with respect ultraviolet rays. A dielectric multilayered-film mirror 115 which is one of mirrors is disposed on the common electrode 17 for pixel portions. Moreover, support portions 21 are disposed on the substrate 11 at the right and left portions (the right and left portions shown in FIG. 17) of the dielectric multilayered-film mirror 115. A diaphragm 117 which is the thin flexible film is formed at the upper surface of each of the support portions 21. Another dielectric multilayered-film mirror 119 is disposed on the lower surface of the diaphragm 117.

A gap 120 is formed between the dielectric multilayered-film mirror 115 and the dielectric multilayered-film mirror 119. Pixel electrodes (made of ITO or the like) 27 which are transparent with respect ultraviolet rays are provided for the surface of the diaphragms 117 such that the pixel electrodes. 27 are disposed opposite to the common electrodes 17 for pixel portions.

The substrate 11 is disposed on a plate-like plane light source 121. For example, an ultraviolet-ray lamp (a low-pressure mercury lamp) 122 for black light is disposed on the side surface of the plane light source 121. The plane light source 121 receives ultraviolet rays emitted from the low-pressure mercury lamp 122 for black light from the side surface thereof to emit the ultraviolet rays from the surface thereof.

An assumption is made that the length of the gap 120 of the active matrix device 111 incorporating the light modulating devices 113 structured as described above realized when voltage is not applied is toff (in a left-hand state of FIG. 18). The foregoing length can be controlled when the device is manufactured. The length of the gap 120 is shortened by dint of the static electric force after the voltage has been applied. An assumption is made that the shortened length is ton (in a right-hand state of FIG. 18). Control of ton can be permitted by using the balance between the applied static electric force and the restoring force which is generated when the diaphragm 117 has been deformed. To perform furthermore stable control, spacers (not shown) may be formed on the electrodes to make constant the displacement. When the spacers are made of insulating material, its dielectric constant (1 or higher) attains an effect of lowering the applied voltage. When the spacers have conductivity, the foregoing effect is furthermore enhanced. The electrodes and the spacers may be made of the same material.

Note that ton and toff are set as follows (m=1).

$$ton = \tfrac{1}{2} \times \lambda^\circ = 180 \text{ nm}$$

($\lambda^\circ$: central wavelength of ultraviolet ray)

$$toff = \tfrac{3}{4} \times \lambda^\circ = 270 \text{ nm}$$

The dielectric multilayered-film mirrors 115 and 119 have light-intensity reflectance R which is 0.85. The gap 121 is filled with air or rare gas having refractive index n which is one. Since ultraviolet rays are collimated, incident angle i on the light modulating portion 85 is substantially zero.

Figure 20:
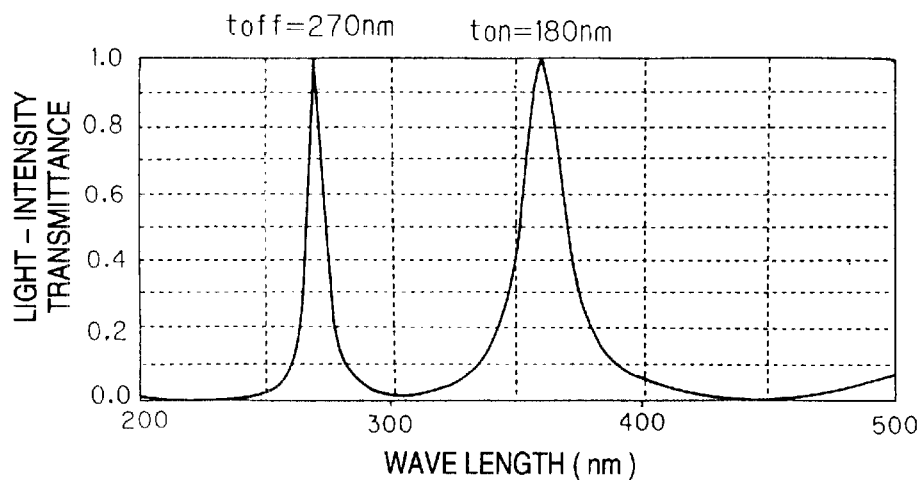
FIG. 20 is a graph showing light-intensity transmittance of a light modulating device.

At this time, the light-intensity transmittance is as shown in FIG. 20. Therefore, when no voltage is applied, toff is 270 nm. As shown in the left-hand state of FIG. 18, substantially no ultraviolet ray is transmitted. If the voltage is applied and, therefore, ton is made to be 180 nm, ultraviolet rays are transmitted as shown in the right-hand state of FIG. 18.

The active matrix device 111 having the light modulating devices 113 which serve as the light function devices is arranged to deflect the diaphragms 117 to generate the multilayered-film interference effect so that modulation of ultraviolet rays is permitted.

If the conditions for the interference are satisfied, combination of the length t of the gap 120, the refractive index n and light-intensity reflectance R of the dielectric multilayered-film mirrors 115 and 119 may arbitrarily be determined.

When the length t is continuously changed by varying the voltage level, the central wavelength of the transmitted spectrum can arbitrarily be changed. Thus, the quantity of transmitted light can continuously be controlled. That is, the gradation can be controlled by varying the applied voltage.

As a modification of the light modulating device 113 according to this embodiment, a backlight comprising a low-pressure mercury lamp may be employed in place of the foregoing low-pressure mercury lamp 122 for black light.

Figure 21:
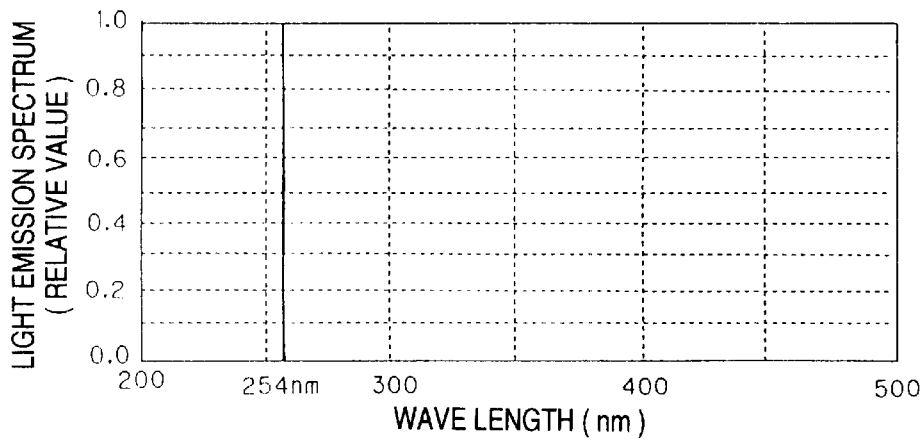
FIG. 21 is a graph showing spectral characteristics of a back light realized by a low-pressure mercury lamp.

The direct light emission spectral characteristics is mainly composed of line spectrum of 254 nm. The foregoing lamp is employed as the light source which is combined with a light conductive plate made of quartz glass so that a backlight unit is constituted. The other wavelengths are cut by filters or the like. At this time, the spectral characteristics of the ultraviolet-ray backlight are as shown in FIG. 21.

The light modulating device has the effective pixel area composed of the elements (the diaphragms, the dielectric multilayered film mirrors and substrates) made of materials which permit penetration of an ultraviolet ray having a wavelength of 254 nm.

Note that ton and toff are set as follows (m=1).

$$ton = \tfrac{1}{2} \times \lambda^\circ = 127 \text{ nm}$$

($\lambda^\circ$: central wavelength of ultraviolet ray)

$$toff = \tfrac{3}{4} \times \lambda^\circ = 191 \text{ nm}$$

Figure 22:
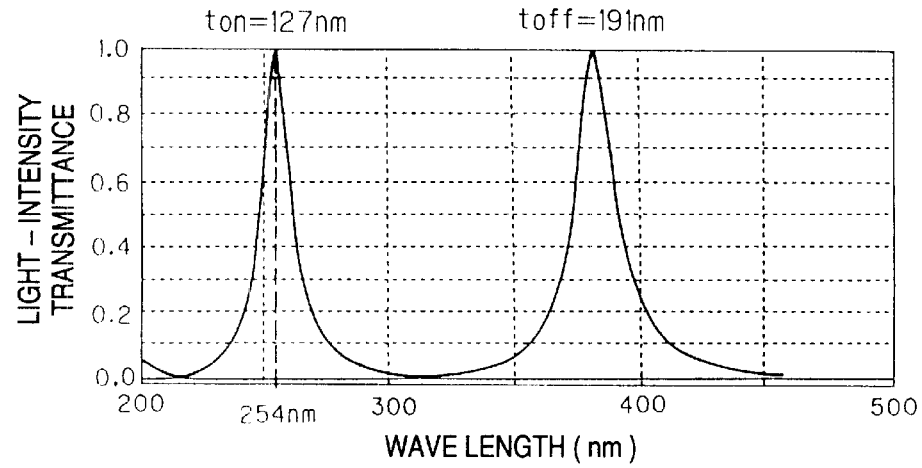
FIG. 22 is a graph showing light-intensity transmittance of the light modulating device.

The other conditions are the same as those of the foregoing example, in which R=0.85, n=1 and i=0. The light-intensity transmittance at this time is as shown in FIG. 22. When no voltage is applied, toff=191 nm. Thus, substantially no ultraviolet ray is transmitted. When ton=127 because of application of the voltage, the ultraviolet ray is transmitted. As described above, modulation of light can be performed Since the ultraviolet ray has a considerably high energy transmittance because of line spectrum in this modification, high-efficiency and high contrast modulation can be performed.

Also in this modification, if the conditions for the interference are satisfied, combination of the length t of the gap 120, the refractive index n and light-intensity reflectance R of the dielectric multilayered-film mirrors 115 and 119 may arbitrarily be determined.

Also in this modification, when the length t is continuously changed by varying the voltage level, the central wavelength of the transmitted spectrum can arbitrarily be changed. Thus, the quantity of transmitted light can continuously be controlled. That is, the gradation can be controlled by varying the applied voltage.

In this embodiment, the Fabry-Perot type light modulating devices 113 are employed as an example. Note that another light modulating devices may be employed if the light modulating devices deflect or move the thin films by the static electric force to change the transmittance of or the reflectance of light to modulate light. Since all of the operation portions of the active matrix device 111 have mechanical structures, the material of the elements can be simplified. Moreover, the efficiency of the manufacturing process can be improved.

In the foregoing embodiments, the active matrix device which is capable of modulating light has been described. The present invention may be applied to an exposing device incorporating the foregoing active matrix devices disposed at essential portions. In the foregoing case, a plane light source which emits, for example, ultraviolet rays, is employed. Thus, ultraviolet rays emitted from the plane light source are modulated to expose an ultraviolet-ray sensitive material.

The foregoing active matrix device may be structured such that a fluorescent member is disposed in the ultraviolet-ray emission portion of the exposing device. Thus, the wavelength of emitted light is converted into that of visible light or an infrared ray so as to expose a visible-light sensitive material or an infrared-ray sensitive material.

The foregoing active matrix device may be applied as a display device having a fluorescent member disposed at the emission portion of the exposing device to cause emitted light to perform display by the fluorescent member.

A tenth embodiment of the active matrix device according to the present invention will now be described (the structures according to the aspects 7 and 8).

Figure 23:
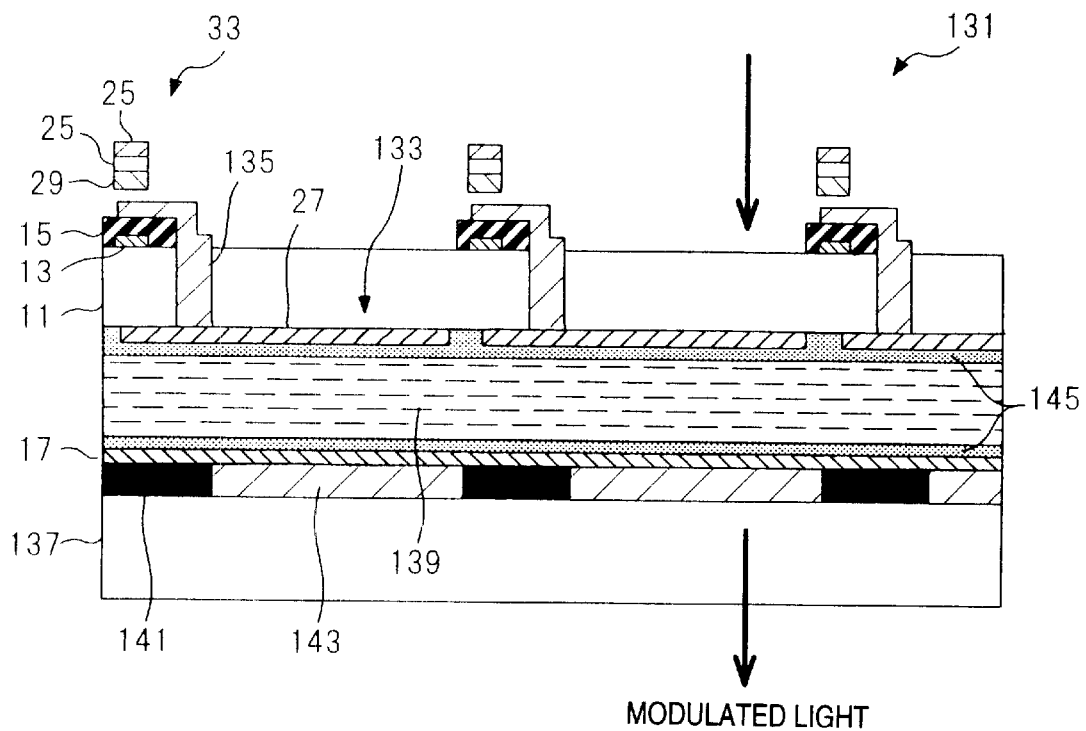
FIG. 23 is a cross sectional view showing a tenth embodiment of the active matrix device in a direction perpendicular to the scanning-signal electrodes.
Figure 24:
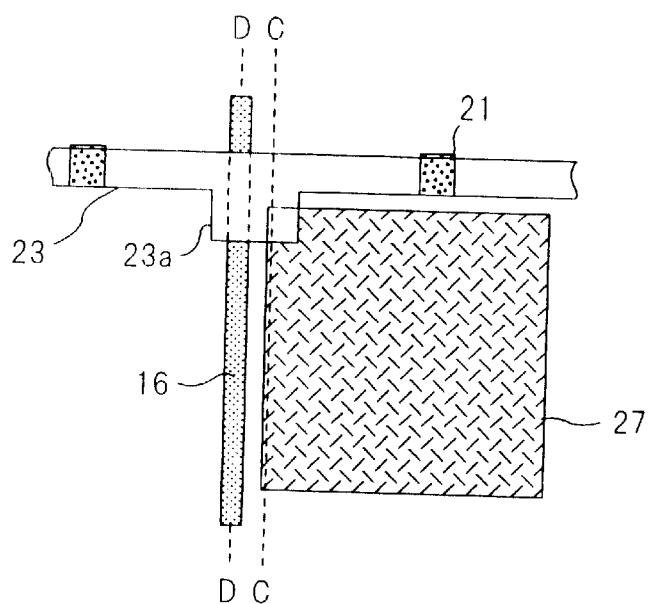
FIG. 24 is a plan view showing an eleventh embodiment of the active matrix device.

FIG. 23 is a cross sectional view showing the active matrix device according to the tenth embodiment in a direction perpendicular to the scanning-signal electrodes.

The active matrix device 131 according to this embodiment incorporates light modulating devices (light modulating layers) 133 for modulating light with voltage (an electric field) or an electric current to serve as the light function devices. The light modulating devices 133 may be made of, for example, liquid crystal.

The pixel electrodes 27 are disposed adjacent to the surface (the lower portion of FIG. 23) of the substrate 11 through a conductive portions 135 formed by filling through holes with conductive material. The common electrodes 13 for scanning signals, the insulating layers 15, the conductive films (made of metal or the like) 29, the thin flexible film (the insulating material) 23 and the scanning-signal electrodes 25 are disposed on the reverse side of the substrate 11 having the pixel electrodes 27 as described above. Thus, mechanically-conductive switches 33 having the structure similar to the foregoing example are constituted.

Another substrate 137 is disposed opposite to the right side (in the lower portion of FIG. 23) of the substrate 11 such that a gap is formed between the two substrates 11 and 137. The gap is filled with liquid crystal 139 for forming the light modulating devices 133. In the foregoing case, it is preferable that liquid crystal 139 is low-molecular-weight liquid crystal, such as nematic liquid crystal, cholesteric liquid crystal or ferroelectric liquid crystal.

The common electrodes 17 for pixel portions are formed on the opposite surface of the other substrate 137. Black matrices 141 and color filters 143 are arbitrarily be formed between the common electrodes 17 for pixel portions and the substrate 137. A oriented film 145 is formed on each of the electrodes 17 and 27. To maintain a predetermined gap between the substrates 11 and 137, the substrate 11 and the substrate 137 are bonded to each other through spacers (not shown) made of silica or the like. After liquid crystal 139 has been injected, the peripheries of the substrates 11 and 137 are sealed. The structure for enclosing liquid crystal can be realized by a known technique.

The active matrix device 131 structured as described above incorporates the mechanically-conductive switches 33 formed on the reverse side of the substrate 11. Moreover, light modulating devices (the light modulating layers) 133 serving as the light function devices are formed on the right side of the substrate 11. That is, the mechanically-conductive switches 33 and the light function devices are formed on different surfaces and electrically connected to one another through the through holes 135.

The foregoing active matrix device 131 is able to enclose a fluid. Therefore, if a light modulating material, such as a fluid exemplified by liquid crystal or gel type material, is employed, an active matrix having the mechanically-conductive switches can be realized. As a result, a low-cost, large-screen and precise exposing device or display device can be designed and/or manufactured.

The foregoing enclosing structure using the through holes 135 may be applied to an active matrix device incorporating the foregoing light modulating devices and light emitting devices except for the liquid crystal.

An eleventh embodiment of the active matrix device according to the present invention will now be described.

Figure 25:
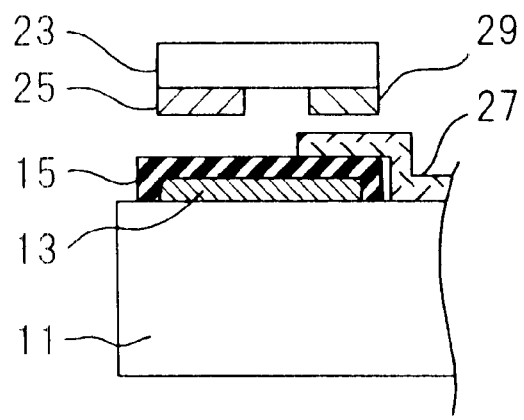
FIG. 25 is a cross sectional view taken along line. C—C show in FIG. 24.

FIG. 25 is a partial plan view showing the active matrix device according to the eleventh embodiment. In this embodiment, the thin flexible film 23 incorporating the scanning-signal electrode and the conductive film has a flange portion 23a to be vertically joined to the pixel electrode at the intersection with the data-signal electrode.

Figure 26:
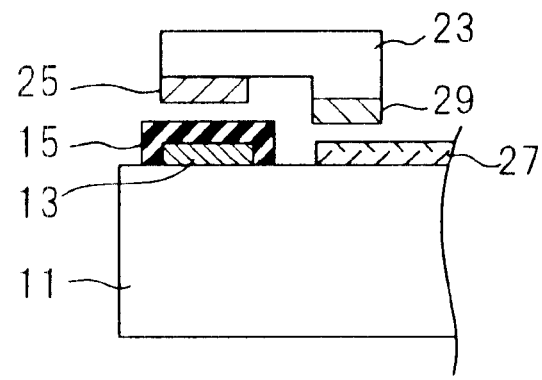
FIG. 26 is a cross sectional view taken along line C—C shown in FIG. 24 for showing another structure.

FIG. 26 is a cross sectional view taken along line C—C shown in FIG. 25. The scanning-signal electrodes 25 are disposed below the thin flexible films 23. The pixel electrodes are provided for only the positions adjacent to the conductive film 29. As a result, the distance between the scanning-signal electrodes 25 and the common electrodes 13 for scanning signals can be shortened. Thus, the voltage required to operate the thin flexible films 23 can be lowered. Since a simple structure can be formed, a malfunction or the like can be prevented.

Figure 27:
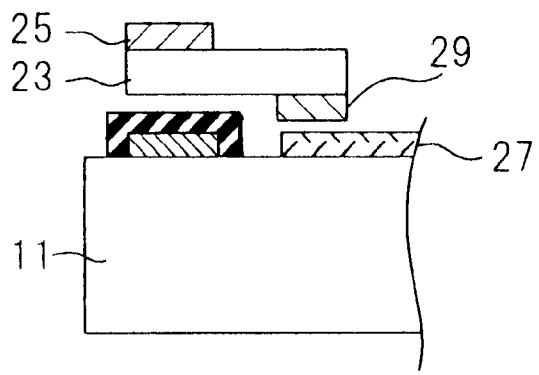
FIG. 27 is a cross sectional view taken along line C—C shown in FIG. 24 for showing another structure.

FIG. 27 shows a modification of the embodiment shown in FIG. 26. In this modification, the pixel electrodes 27 are formed on the substrate 11.

Figure 28:
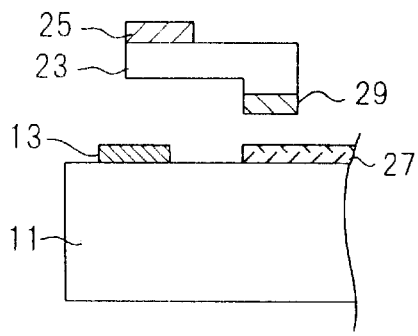
FIG. 28 is a cross sectional view taken along line C—C shown in FIG. 24 for showing another structure.

FIG. 28 shows a structure in which the scanning-signal electrodes 25 each having the structure shown in FIG. 27 are disposed above the thin flexible films 23.

Figure 29:
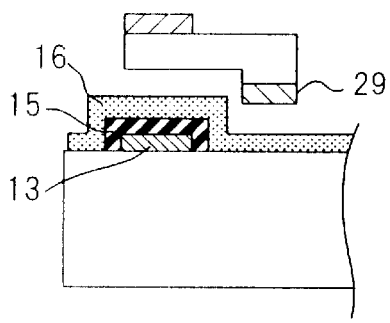
FIG. 29 is a cross sectional view taken along line D—D shown in FIG. 24 showing the structure shown in FIG. 29.
Figure 30:
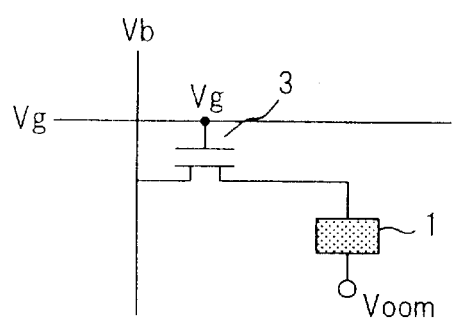
FIG. 30 shows an equivalent circuit to pixel portions of the conventional active matrix device.
Figure 31:
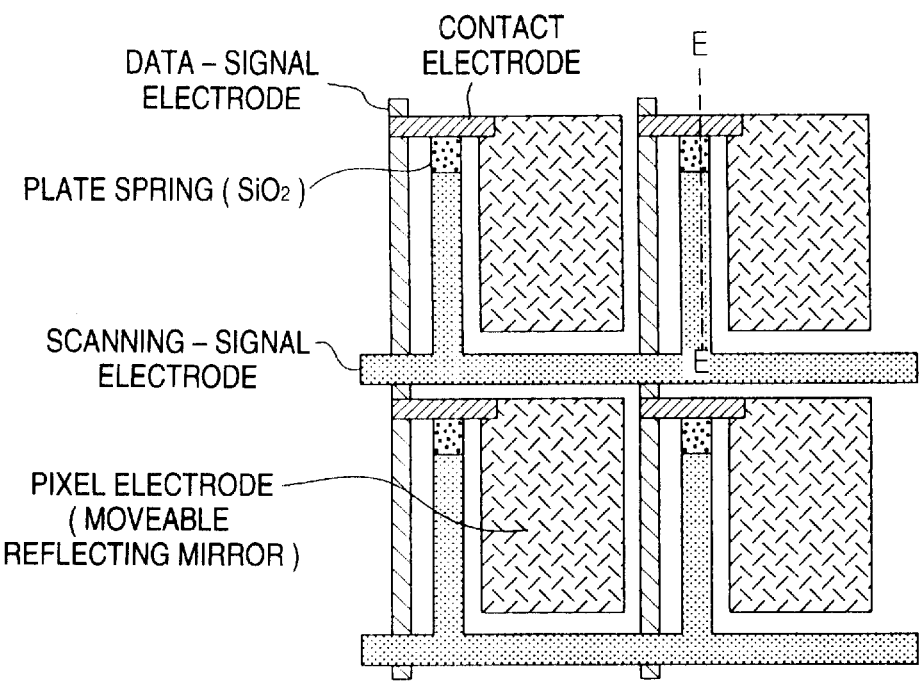
FIG. 31 is a plan view showing a conventional active matrix device.
Figure 32:
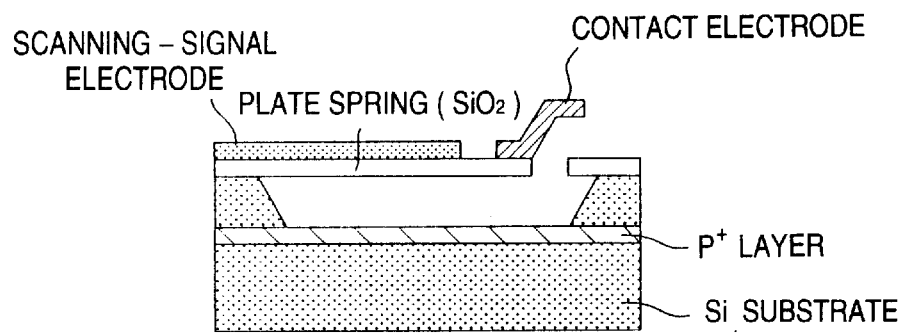
FIG. 32 is a cross sectional view taken along line E—E shown in FIG. 31.
Figure 33:
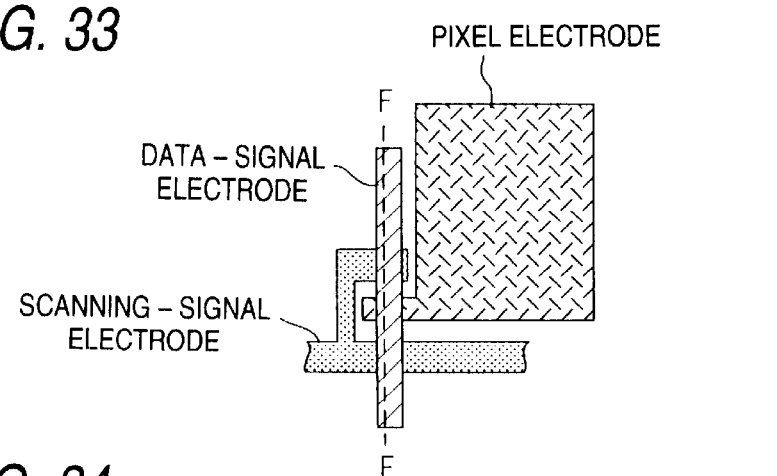
FIG. 33 is a plan view showing another conventional active matrix device.
Figure 34:
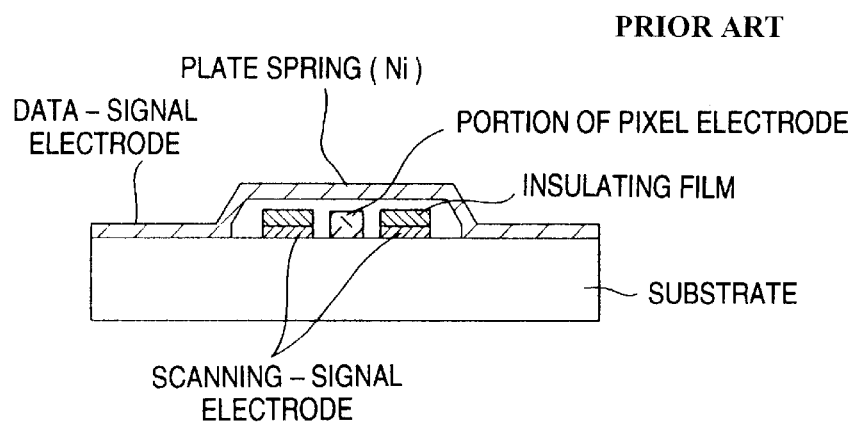
FIG. 34 is a cross sectional view taken along line F—F shown in FIG. 34.
Figure 35:
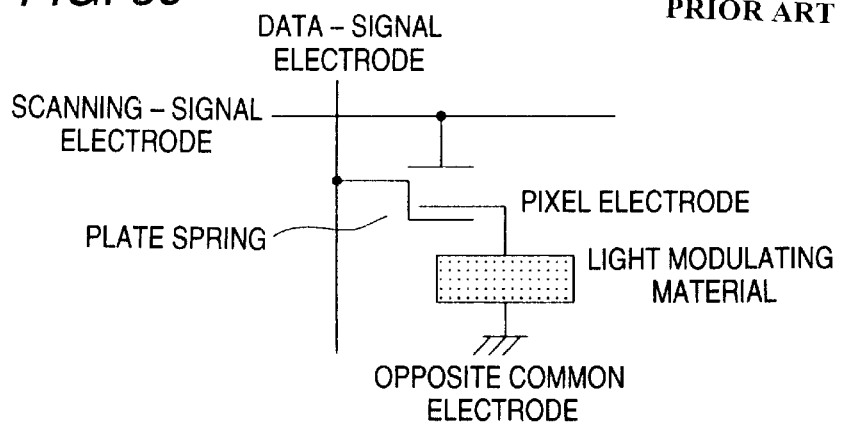
FIG. 35 is a diagram showing an equivalent circuit to the active matrix device shown in FIG. 33.

FIG. 29 is a cross sectional view taken along line C—C shown in FIG. 25 according to another embodiment. In this embodiment, no insulating layer is formed on the common electrodes 13 for scanning signals. In this case, as shown in FIG. 30 which is a cross sectional view taken along line D—D, insulating layers must be formed in the intersections between the common electrodes 13 for scanning signals and the data-signal electrodes 16.

In each of the foregoing embodiments, the active matrix device serves as the exposing device, the light modulating device and the display device. The active matrix device according to the present invention may be an image pickup device for performing 2D image pickup. In the foregoing case, light detecting devices are provided to serve as the light function devices. The mechanically-conductive switches may be structured similarly to those according to each of the foregoing embodiments.

The foregoing active matrix device incorporates the light detecting device of each pixel which photoelectrically converts light of an image so as to accumulate the same as charges. The accumulated charges are, in a row-sequential manner, scanned through the mechanically-conductive switches to extract the accumulated charges. Thus, serial electric signals can be output to the outside.

Also the above-mentioned active matrix device attains effects similar to those obtainable from each of the foregoing embodiments when the MOS transistors are the mechanically-conductive switches.

As described above, the active matrix device according to the present invention incorporates the mechanically-conductive switches disposed at the intersections of the scanning-signal electrodes and the data-signal electrodes disposed in the matrix configuration. Therefore, the switch portions can mechanically be operated in place of the conventional MOS semiconductor switch portions disposed at the intersections.

Moreover, the process for forming films and the process for doping impurities which are peculiar to the process for manufacturing the semiconductor are not required. The number of patterning process can be reduced and the design conditions can be moderated. As a result, the throughput and the manufacturing yield can be improved. Thus, enlargement of the area can be permitted at a low cost.

Since the conductive films are made of metal, the mobility of carriers can significantly be enhanced as compared with the conventional semiconductor switch portions. As a result, high-speed response can be expected under the conditions of a precise and large area structure.

Since a process for forming a semiconductor film is not required, the necessity of severely administering the joining conditions and the density of the impurities can be eliminated. Thus, the processing conditions can be moderated.

Since the mechanically-conductive switches are employed, an adverse influence of incidence of light and introduction of water, oxygen, ions and an organic material from outside can satisfactorily be eliminated as compared with the semiconductor. As a result, a malfunction occurring due to the disturbance can be prevented. As a result, the reliability of the operation and durability can be improved.

Since the mechanically-conductive switches are formed on the transparent substrate, such as the glass substrate, cost reduction and enlargement of the area can easily be realized. The present invention may be applied to the transmission-type light modulating devices.

Since the mechanically-conductive switches are constituted by the thin flexible films having two ends supported as described above, a high-speed and stable switching operation can be performed.

What is claimed is:

1. An active matrix device comprising: a substrate on which lines of scanning-signal electrode and lines of data-signal electrode are allowed to intersect one another to one or two dimensionally dispose electrodes and structured such that at least one matrix operating means and a light function device are provided for each intersection, wherein said matrix operating means is a mechanically-conductive switch which is operated by static electric force and wherein said mechanically-conductive switch makes said data-signal electrode electrically contact a pixel electrode by applying a voltage between a first scanning electrode and a conductive film opposed to said first scanning electrode, wherein said scanning-signal electrode comprises a first scanning-signal electrode and a second scanning-signal electrode disposed opposite to said first scanning-signal electrode, and said mechanically-conductive switch has a thin flexible film which is moved by dint of a voltage which is applied between said first scanning-signal electrode and said second scanning-signal electrode to bring said data-signal electrode and a pixel electrode of said light function device into electrical contact with each other.

2. An active matrix device comprising: a substrate on which lines of scanning-signal electrode and lines of data-signal electrode are allowed to intersect one another to one or two dimensionally dispose electrodes and structured such that at least one matrix operating means and a light function device are provided for each intersection, wherein said matrix operating means is a mechanically-conductive switch which is operated by static electric force and wherein said mechanically-conductive switch makes said data-signal electrode electrically contact a pixel electrode by applying a voltage between a first scanning electrode and a conductive film opposed to said first scanning electrode, wherein said light function devices are disposed one or two dimensionally, and said active matrix device comprises: a plurality of parallel first scanning-signal electrodes in the form of stripes formed on a substrate; a plurality of parallel data-signal electrodes in the form of stripes disposed perpendicular to said first scanning-signal electrodes and formed, at least at intersections with said first scanning-signal electrodes through insulating layers; common electrodes for pixel portions, light function devices and pixel electrodes which are sequentially laminated in a region on said substrate surrounded by said first scanning-signal electrodes and said data-signal electrodes;

a plurality of support portions formed on the upper surfaces of said first scanning-signal electrodes; and thin flexible films and second scanning-signal electrodes disposed opposite to said first scanning-signal electrodes and laminated to be supported at the top ends of said support portions; and conductive films which are disposed opposite to said data-signal electrodes and said pixel electrodes such that contact is permitted through gaps and which are provided for said thin flexible films.

3. An active matrix device comprising: a substrate on which lines of scanning-signal electrode and lines of data-signal electrode are allowed to intersect one another to one or two dimensionally dispose electrodes and structured such that at least one matrix operating means and a light function device are provided for each intersection, wherein said matrix operating means is a mechanically-conductive switch which is operated by static electric force and wherein said mechanically-conductive switch makes said data-signal electrode electrically contact a pixel electrode by applying a voltage between a first scanning electrode and a conductive film opposed to said first scanning electrode, wherein said light function devices are disposed one or two dimensionally by mechanically-conductive switches which are operated by static electric force, said active matrix device comprises:

a plurality of parallel first scanning-signal electrodes in the form of stripes formed on a substrate; a plurality of parallel data-signal electrodes in the form of stripes disposed perpendicular to said first scanning-signal electrodes and formed at least at intersections with said first scanning-signal electrodes through insulating layers such that said first scanning-signal electrodes are extended to substantially the overall region on said substrate surrounded by said first scanning-signal electrodes and said data-signal electrodes so that light function devices and pixel electrodes are sequentially laminated on said extended first scanning-signal electrodes; and a plurality of support portions formed on said insulating layers; and thin flexible films and second scanning-signal electrodes disposed opposite to said first scanning-signal electrodes and laminated to be supported at the top ends of said support portions; and conductive films which are disposed opposite to said data-signal electrodes and said pixel electrodes such that contact is permitted through gaps and which are provided for said thin flexible films.

4. An active matrix device comprising: a substrate on which lines of scanning-signal electrode and lines of data-signal electrode are allowed to intersect one another to one or two dimensionally dispose electrodes and structured such that at least one matrix operating means and a light function device are provided for each intersection, wherein said matrix operating means is a mechanically-conductive switch which is operated by static electric force and wherein said mechanically-conductive switch makes said data-signal electrode electrically contact a pixel electrode by applying a voltage between a first scanning electrode and a conductive film opposed to said first scanning electrode, wherein said light function devices are disposed one or two dimensionally, and said active matrix device comprises:

a plurality of parallel first scanning-signal electrodes in the form of stripes formed on a substrate; a plurality of parallel data-signal electrodes in the form of stripes disposed perpendicular to said first scanning-signal electrodes and formed at least at intersections with said first scanning-signal electrodes through insulating layers; pixel electrodes, light function devices and common electrodes for pixel portions which are sequentially laminated in a region on said substrate surrounded by said first scanning-signal electrodes and said data-signal electrodes;

a plurality of support portions formed on said insulating layers; and thin flexible films and second scanning-signal electrodes disposed opposite to said first scanning-signal electrodes and laminated to be supported at the top ends of said support portions; and conductive films which are disposed opposite to said data-signal electrodes and said pixel electrodes such that contact is permitted through gaps and which are provided for said thin flexible films.

5. An active matrix device according to claim 4, further comprising an upper substrate disposed opposite to said substrate, structured to hold said thin flexible films and said signal electrodes disposed on said substrate and joined to the upper surface of said common electrodes for said pixel portions.

6. An active matrix device comprising: a substrate on which lines of scanning-signal electrode and lines of data-signal electrode are allowed to intersect one another to one or two dimensionally dispose electrodes and structured such that at least one matrix operating means and a light function device are provided for each intersection, wherein said matrix operating means is a mechanically-conductive switch which is operated by static electric force and wherein said mechanically-conductive switch makes said data-signal electrode electrically contact a pixel electrode by applying a voltage between a first scanning electrode and a conductive film opposed to said first scanning electrode, wherein said light function devices disposed one or two dimensionally and arranged to be operated by mechanically-conductive switches which are operated by static electric force, wherein said thin flexible film switches and said light function devices are formed on individual surfaces and said mechanically-conductive switches and said light function devices are electrically connected to one another.

7. An active matrix device according to claim 6, wherein a plurality of parallel first scanning-signal electrodes in the form of stripes are formed on the right side of a first substrate, a plurality of parallel data-signal electrodes in the form of stripes disposed perpendicular to said first scanning-signal electrodes are formed at least at intersections with said first scanning-signal electrodes through insulating layers, pixel electrodes, light function devices and common electrodes for pixel portions are sequentially laminated in a reverse side region of said first substrate surrounded by said first scanning-signal electrodes and said data-signal electrodes, a second substrate is, through a color filter, joined to the surface of said light function device opposite to said first substrate such that said second substrate is disposed opposite to said first substrate, a plurality of support portions are formed on said insulating layers of said first substrate, thin flexible films and second scanning-signal electrodes disposed opposite to said first scanning-signal electrodes are laminated to be supported at the top ends of said support portions, the right and reverse sides of said first substrate are conducted to each other to extend said pixel electrodes of said light function devices to positions adjacent to said- data-signal electrodes, and conductive films disposed opposite to said data-signal electrodes and said pixel electrodes such that contact is permitted through gaps are provided for said thin flexible films.

8. An active matrix device according to claim 7, wherein the two ends of said thin flexible film are supported.

9. An active matrix device according to claim 7, wherein said thin flexible film having a length substantially corresponding to the length of one pixel is provided for each pixel.

10. An active matrix device according to claim 7, wherein said conductive film is made of metal.

11. An active matrix device according to claim 10, wherein a plurality of said mechanically-conductive switches are provided for one pixel.

12. An active matrix device according to claim 11, wherein said plural mechanically-conductive switches are connected in series.

13. An active matrix device according to claim 11, wherein said plural mechanically-conductive switches are connected in parallel.

* * * * *